US012812959B2

(12) United States Patent
Lee et al.

(10) Patent No.: US 12,812,959 B2
(45) Date of Patent: Nov. 24, 2026

(54) BACKSIDE DIELECTRIC PLUG

(71) Applicant: Taiwan Semiconductor Manufacturing Company, Ltd., Hsin-Chu (TW)

(72) Inventors: Chen-Ming Lee, Taoyuan County (TW); Shih-Chieh Wu, Hsinchu (TW); Po-Yu Huang, Hsinchu (TW); I-Wen Wu, Hsinchu City (TW); Fu-Kai Yang, Hsinchu City (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 492 days.

(21) Appl. No.: 18/481,679

(22) Filed: Oct. 5, 2023

(65) Prior Publication Data

US 2025/0120122 A1 Apr. 10, 2025

(51) Int. Cl.
*H10D 84/01* (2026.01)
*H10D 62/10* (2025.01)
(Continued)

(52) U.S. Cl.
CPC ....... *H10D 84/0149* (2025.01); *H10D 62/115* (2025.01); *H10D 62/121* (2025.01);
(Continued)

(58) Field of Classification Search
CPC ............. H10D 84/0149; H10D 62/115; H10D 62/121; H10D 64/2565; H10D 84/0151; H10D 84/038; H10D 84/832; H10D 30/6735; H10D 30/6757; H10D 30/014; H10D 30/43; H10D 84/0167; H10D 84/017; H10D 84/83; H10D 84/85;
(Continued)

(56) References Cited

U.S. PATENT DOCUMENTS

2012/0273886 A1* 11/2012 Zhong .................... H10D 30/60
257/E21.409
2022/0130759 A1* 4/2022 Huang ................ H10W 20/427
(Continued)

FOREIGN PATENT DOCUMENTS

| | | | |
|---|---|---|---|
| TW | I565057 | A | 1/2017 |
| TW | 202310285 | A | 3/2023 |
| TW | 202329456 | A | 7/2023 |

*Primary Examiner* — Earl N Taylor
(74) *Attorney, Agent, or Firm* — HAYNES AND BOONE, LLP

(57) ABSTRACT

One aspect of the present disclosure pertains to a semiconductor device. The semiconductor device includes a semiconductor substrate and a transistor formed over the semiconductor substrate. The transistor includes a first source/drain (S/D) feature, a second S/D feature, a channel region interposed between the first and second S/D features, and a gate stack engaging the channel region. The semiconductor device includes a first S/D contact landing on a top surface of the first S/D feature, a second S/D contact landing on a top surface of the second S/D feature, and a dielectric plug penetrating through the semiconductor substrate and landing on a bottom surface of the first S/D feature. The dielectric plug spans a width equal to or smaller than a width of the first S/D feature.

20 Claims, 38 Drawing Sheets

(51) Int. Cl.
*H10D 64/23* (2025.01)
*H10D 84/03* (2025.01)
*H10D 84/83* (2025.01)

(52) U.S. Cl.
CPC ..... *H10D 64/2565* (2025.01); *H10D 84/0151* (2025.01); *H10D 84/038* (2025.01); *H10D 84/832* (2025.01)

(58) Field of Classification Search
CPC .......... H10D 30/6729; H01L 29/41733; H01L 29/0649; H01L 29/0673; H01L 29/42392; H01L 29/66439; H01L 29/775; H01L 29/78696; H01L 21/823807; H01L 21/823814; H01L 27/092
See application file for complete search history.

(56) References Cited

U.S. PATENT DOCUMENTS

| | | | | |
|---|---|---|---|---|
| 2022/0328648 | A1* | 10/2022 | Wong | H10D 64/017 |
| 2022/0352326 | A1* | 11/2022 | Huang | H10D 64/017 |
| 2024/0072133 | A1* | 2/2024 | Xie | H10D 30/014 |
| 2024/0072134 | A1* | 2/2024 | Xie | H10D 30/6729 |
| 2024/0164089 | A1* | 5/2024 | Chu | H10B 20/20 |
| 2024/0347423 | A1* | 10/2024 | Mukesh | H10D 30/6757 |
| 2024/0379442 | A1* | 11/2024 | Wu | H10D 62/151 |
| 2025/0048686 | A1* | 2/2025 | Wang | H10D 62/115 |

* cited by examiner

BACKSIDE DIELECTRIC PLUG

BACKGROUND

The integrated circuit (IC) industry has experienced exponential growth. Technological advances in semiconductor manufacturing have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased. Typically, scaling down has been limited only by an ability to lithographically define IC features at the ever-decreasing geometry sizes.

As feature sizes continue to decrease, some IC features such as source/drain metal contacts and power line connections may be formed on a backside of a semiconductor substrate. This allows for better spacing management while optimizing power consumption. Forming backside IC features involve thinning down the substrate from a back side. In some cases, the thinned down substrate is then replaced with a dielectric layer to reduce parasitic capacitance and unwanted coupling in the device. However, replacing the thinned down substrate is not a trivial step. Traditionally, the thinned down substrate is totally removed by a dry etch process, which is hard to control due to recess depth loading and may cause gate dielectric damage or threshold voltage shift.

Therefore, although existing methods of replacing a semiconductor substrate with a dielectric have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments. Further, the accompanying figures may implicitly describe features not explicitly described in the detailed description.

DETAILED DESCRIPTION

Figure 1:
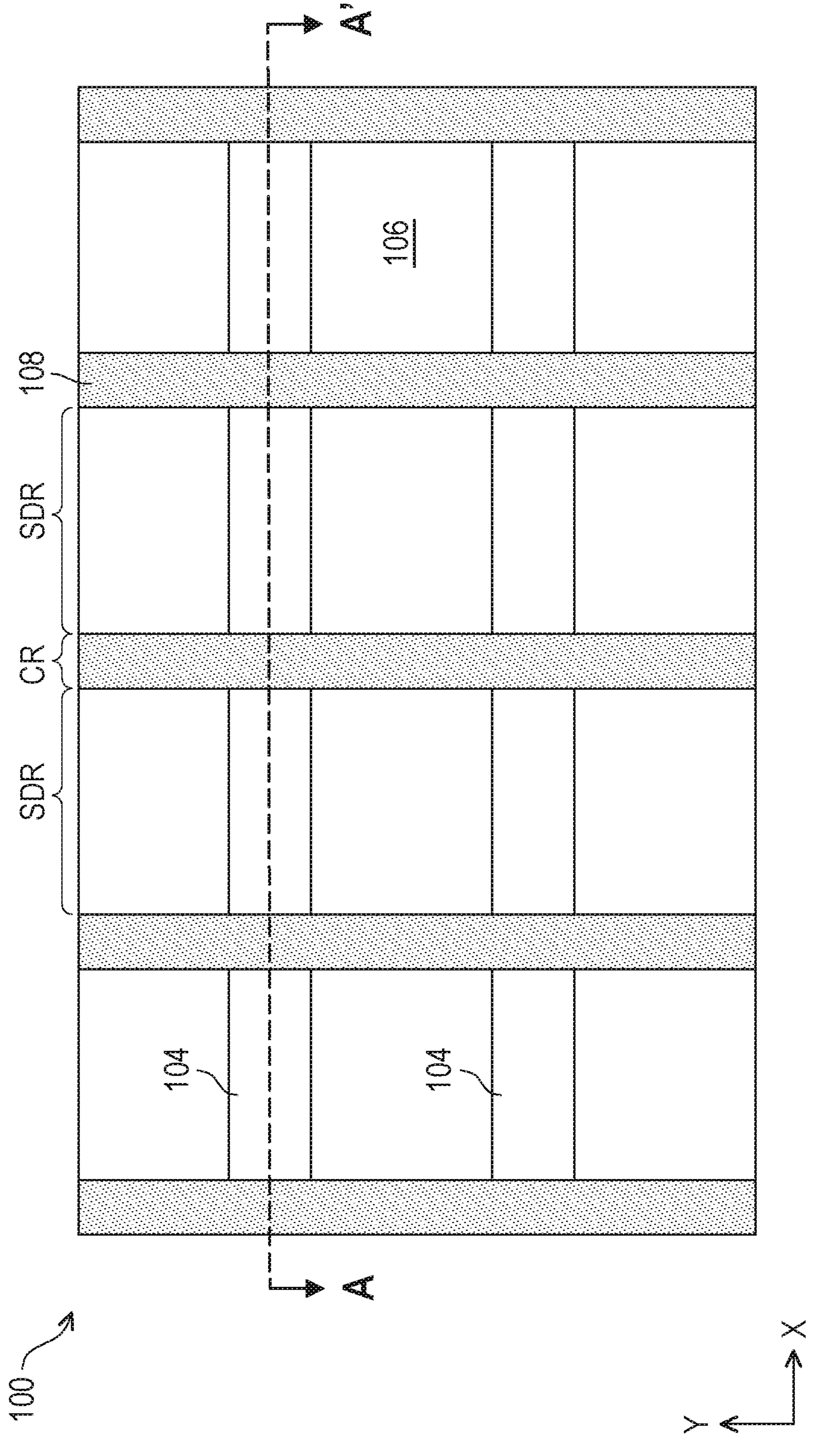
FIG. 1 illustrates a top view of a semiconductor device, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximately," and the like, the term is intended to encompass numbers that are within a reasonable range including the number described, such as within +/−10% of the number described, or other values as understood by person skilled in the art. For example, the term "about 5 nm" may encompass the dimension range from 4.5 nm to 5.5 nm. And when comparing a dimension or size of a feature to another feature, the phrases "substantially the same," "essentially the same," "of similar size," and the like, are understood to be within +/−10% between the compared features, or other values as understood by person skilled in the art. Further, disclosed dimensions of the different features can implicitly disclose dimension ratios between the different features.

The present disclosure relates to semiconductor devices having backside dielectric plugs. To reduce parasitic capacitance and current leakage, a semiconductor substrate may be replaced with a dielectric material in a backside process. However, bulk replacement of the semiconductor substrate may cause gate dielectric damage from the backside. Specifically, there is risk of over-etching in areas directly under a bottom surface of the gate stacks, thereby causing threshold voltage shift. Further, wholesale replacement of the semiconductor substrate also reduces heat dissipation of the device. To address these issues, the present disclosure presents a backside process that forms backside dielectric plugs through the semiconductor substrate vertically aligned with a backside of the source/drain features. The backside dielectric plugs are spaced away from the bottom surface of the gate stacks to prevent gate dielectric damage. Since the backside dielectric plugs are spaced away from the gate stacks, it is possible to have an extra epitaxial recess into the source/drain features. This extra epitaxial recess allows the dielectric plugs to penetrate deeper into the backside of the source/drain features, thereby preserving the benefit of parasitic capacitance reduction with only partial substrate removal. Further, partial substrate removal also allows the remaining semiconductor substrate to provide better heat dissipation.

To illustrate the various aspects of the present disclosure, methods of forming a semiconductor device are discussed below. Embodiments shown in the present disclosure are implemented with Gate-All-Around (GAA) field effect transistors (FETs), but the present disclosure is not limited thereto. GAA FETs refer to transistors having gate stacks (gate electrodes and gate dielectric layers) surrounding transistor channels, such as vertically-stacked gate-all-around horizontal nanowire or nanosheet MOSFET devices. Those of ordinary skill in the art should appreciate that they may readily use the present disclosure as a basis for designing or modifying other structures for carrying out the same purposes and/or achieving the same advantages of the embodiments introduced herein.

FIG. 1 illustrates a top view of a semiconductor device 100, according to an embodiment of the present disclosure. The semiconductor device 100 has a corresponding semiconductor structure, and the two terms (i.e., device and structure) may be used interchangeably. The semiconductor device 100 may be a portion of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof.

In the embodiment shown, the semiconductor device 100 includes fin active regions 104 extending lengthwise along the x direction and gate structures 108 extending lengthwise along the y direction over the fin active regions 104. The fin active regions 104 are separated from each other by an isolation structure 106. The isolation structure 106 provides isolation between adjacent fin active regions 104 and may be a shallow trench isolation (STI) layer. The isolation structure 106 may include silicon oxide, silicon oxynitride, fluorine-doped silicate glass (FSG), a low-k dielectric, combinations thereof, and/or other suitable materials. In the present embodiment, the isolation structure 106 is disposed over a semiconductor substrate 102 (not shown in this view, but shown e.g., in FIGS. 2-4). The fin active regions 104 protrudes from the semiconductor substrate 102 to above the isolation structure 106. Each of the fin active regions 104 includes source drain regions SDR on adjacent sides of channel regions CR. The channel regions CR are defined by portions of the fin active regions 104 directly underneath the gate structures 108. Still referring to FIG. 1, the A-A' lines cuts along one of the fin active regions 104 in the x direction across several gate structures 108. The line A-A' is chosen to illustrate cross-sectional views of various feature formations along the fin active region 104.

Figure 2:
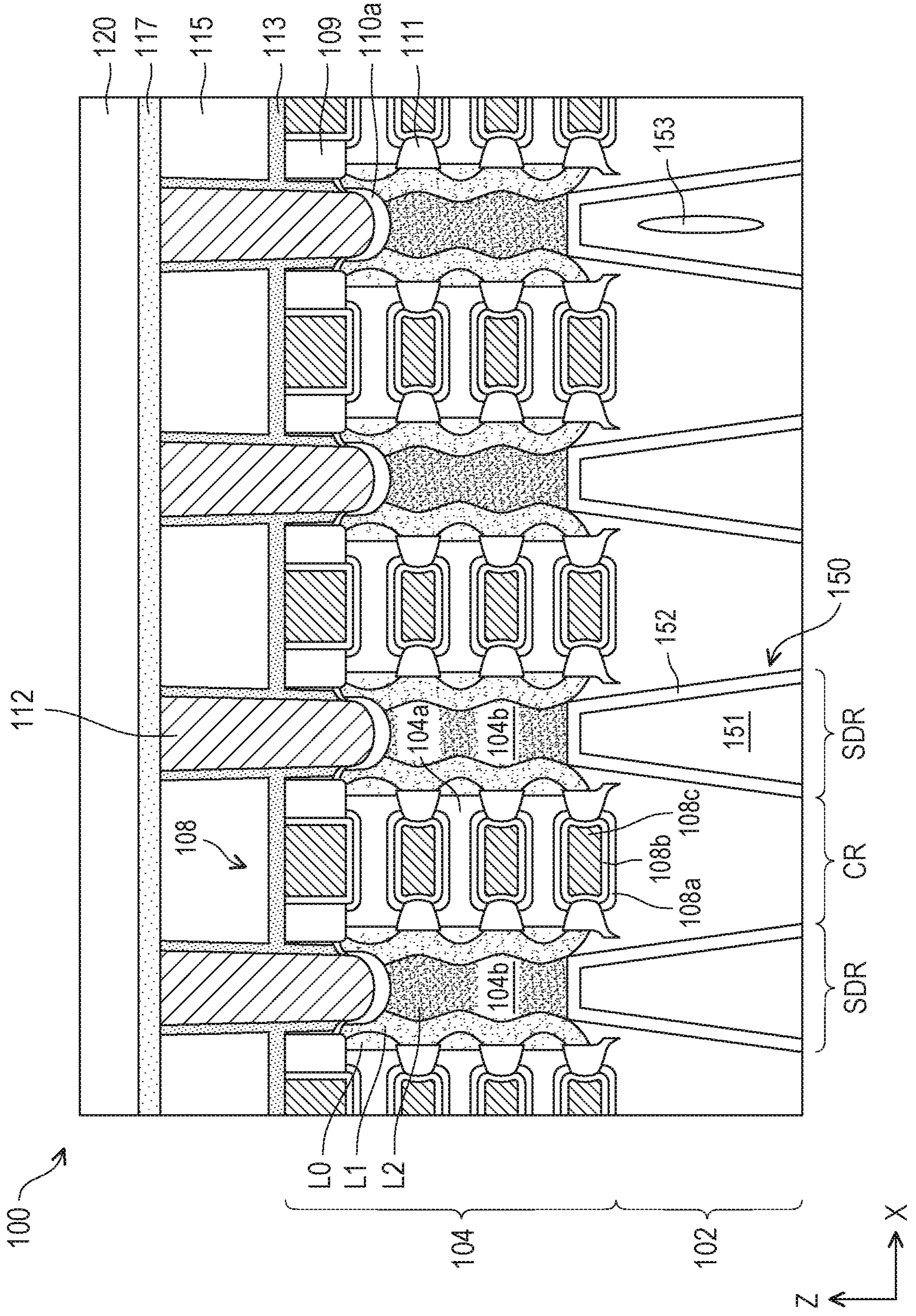
FIGS. 2-4 illustrate cross-sectional views of a semiconductor device cut along the lines A-A' in FIG. 1, according to different embodiments of the present disclosure.

FIG. 2 illustrates a cross-sectional view of a semiconductor device 100 cut along the lines A-A' in FIG. 1, according to an embodiment of the present disclosure. As shown in FIG. 2, a fin active region 104 protrudes above and is disposed over a semiconductor substrate 102. The semiconductor substrate 102 may be a silicon (Si) substrate, or a substrate having other semiconductor materials such as germanium (Ge), silicon carbide (SiC), silicon germanium (SiGe), or diamond. The source drain regions SDR of the fin active region 104 includes epitaxial source/drain (S/D) features **104*b*, and the channel regions CR of the fin active region 104 includes one or more transistor channels 104*a*. The epitaxial S/D features 104*b* may be doped with n-type dopants and/or p-type dopants. In some embodiments, for n-type transistors, epitaxial S/D features 104*b* include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 104*b* include silicon germanium or germanium and can be doped with boron, other p-type dopant, or combinations thereof (for example, forming Si:Ge:B epitaxial source/drain features). The epitaxial features 104*b* may include different portions L0, L1, L2 that have different doping concentrations. In an embodiment, the portions L2 has higher doping concentration than the portions L1, and the portions L1 have a higher doping concentration than the portions L0. In other words, portions of the epitaxial features 104*b* closer to the transistor channels 104*a* have lower doping concentrations than portions of the epitaxial features 104*b* laterally away from the transistor channels 104*a***.

Gate structures (or gate stacks) 108 are disposed over the one or more transistor channels **104*a* in the channel regions CR. Each of the gate structures 108 may include an interfacial layer 108*a* (e.g., a silicon oxide layer), a gate dielectric layer 108*b* over the interfacial layer 108*a*, and a gate electrode 108*c* over the gate dielectric layer 108*b*. The gate dielectric layer 108*b* includes a high-k dielectric material, such as materials having a dielectric constant greater than silicon oxide (k≈3.9). The gate dielectric layer 108*b* may include HfO, LaO, ZrO, AlO, TiO, or TaO. The gate electrode includes a suitable conductive material, such as Al, W, Co, TiAl, TiN, or other metal gate materials. As shown, the interfacial layer 108*a*, the gate dielectric layer 108*b*, and the gate electrode 108*c* may each wrap around multiple transistor channels 104*a* in a channel region CR. The channel regions CR may further include spacer features such as gate spacers 109 and inner spacers 111. The gate spacers 109 may line sidewalls of the gate structure 108 above the topmost channels 104*a*, and the inner spacers may be vertically disposed between transistor channels 104*a* and laterally disposed between the gate structures 108 and the epitaxial S/D features 104*b*. The gate spacers 109 and the inner spacers 111 may include silicon oxide, silicon nitride, silicon oxycarbide, silicon oxycarbonitride, silicon carbonitride, metal nitride, or a suitable dielectric material. In an embodiment, the gate spacers 109 and the inner spacers 111** includes different materials for etchant selectivity.

The fin active region 104 and the gate structures 108 define one or more transistors, each transistor having a first epitaxial S/D feature 104*b*, a second epitaxial S/D feature 104*b*, a channel region CR interposed between the first and second epitaxial S/D features 104*b*, and a gate structure 108 engaging and disposed over the channel region CR. Additional structures are formed over the one or more transistors, such as frontside S/D contacts 112 that electrically connect to the epitaxial S/D features 104*b*. The frontside S/D contacts 112 may include titanium (Ti), ruthenium (Ru), copper (Cu), nickel (Ni), cobalt (Co), tungsten (W), tantalum (Ta), or molybdenum (Mo). In an embodiment, frontside silicide features 110*a* are first formed over the epitaxial S/D features 104*b*, then the S/D contacts are formed over the frontside silicide features 110*a*. The silicide features may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. Various dielectric layers may surround and line surfaces of the frontside S/D contacts 112. As shown, there may be etch stop layers and/or barrier layers 113 that are disposed on sidewalls of the frontside S/D contacts 112 as well as over top surfaces of the gate structures 108 and gate spacers 109. There may also be an interlayer dielectric (ILD) layer 115 disposed over the gate structures 108 and between the frontside S/D contacts 112. In this embodiment, top surfaces of the frontside S/D contacts 112 are disposed above the top surfaces of the gate structures 108. Further, another etch stop layer 117 may be disposed over the frontside S/D contacts 112 and the ILD layer 115. The etch stop layers 113 and 117 may include silicon nitride, and the ILD layer 115 may include a different material (e.g., silicon oxide) from the etch stop layers 113 and 117 for etchant selectivity.

The various features described above are formed on a frontside of the semiconductor device 100 and over the substrate 102. Additional IC features may be formed on the frontside. For example, an interconnect structure 120 is formed over the frontside S/D contacts 112. The interconnect structure 120 electrically couple various devices (for example, p-type transistors and/or n-type GAA transistors of the device 100, other transistors, resistors, capacitors, and/or inductors) and/or components (for example, gate structures and/or epitaxial source/drain features of p-type transistors and/or n-type transistors), such that the various devices and/or components can operate as specified by design requirements of the device 100. The interconnect structure 120 includes a combination of dielectric layers and electrically conductive layers (e.g., metal layers) configured to form various interconnect features. The conductive layers are configured to form vertical interconnect features, such as vias and/or horizontal interconnect features, such as conductive lines. Vertical interconnect features typically connect horizontal interconnect features in different layers (or different planes) of the interconnect layer. During operation, the interconnect structure 120 is configured to route signals between the devices and/or the components of the device 100 and/or distribute signals (for example, clock signals, voltage signals, and/or ground signals) to the devices and/or the components of the device 100.

Still referring to FIG. 2, backside dielectric plugs 150 are disposed directly below and landing on a bottom surface of the epitaxial S/D features 104*b*. As will be described, these backside dielectric plugs 150 are formed from a backside of the semiconductor device 100. As shown, the backside dielectric plugs 150 are vertically aligned with the epitaxial S/D features 104*b* and the frontside S/D contacts 112. The backside dielectric plugs 150 may horizontally span between gate structures 108 (or channel regions CR) and have a width equal to or smaller than a width of the epitaxial S/D features 104*b* along the x direction. In an embodiment, the backside dielectric plugs 150 have substantially a same width as the frontside S/D contacts 112. The backside dielectric plugs 150 penetrate through and are surrounded by the semiconductor substrate 102. A top surface of the backside dielectric plugs 150 is above a bottom surface of the gate structures 108. The backside dielectric plugs 150 may include silicon oxide, silicon nitride, a low-k dielectric material, or a combination thereof. In the embodiment shown, the backside dielectric plugs 150 includes a barrier layer 152 surrounding a dielectric fill layer 151. The barrier layer 152 may reduce oxidation defects between the semiconductor substrate 102 and the dielectric fill layer 151. The barrier layer 152 may include silicon nitride, and the dielectric fill layer 151 may include silicon oxide or a low-k dielectric material. The barrier layer 152 directly contacts the bottom surface of the epitaxial S/D features 104*b*. Although the barrier layer 152 may be included as part of the backside dielectric plugs 150, the present disclosure is not limited thereto. For example, in some embodiments, the backside dielectric plugs 150 does not include the barrier layer 152 and only includes the dielectric fill layer 151, where the dielectric fill layer 151 includes silicon nitride, silicon oxide, or a low-k dielectric material. In further embodiments, the backside dielectric plugs 150 may include one or more air gaps 153 for further improvements to parasitic capacitance reduction.

Figure 3:
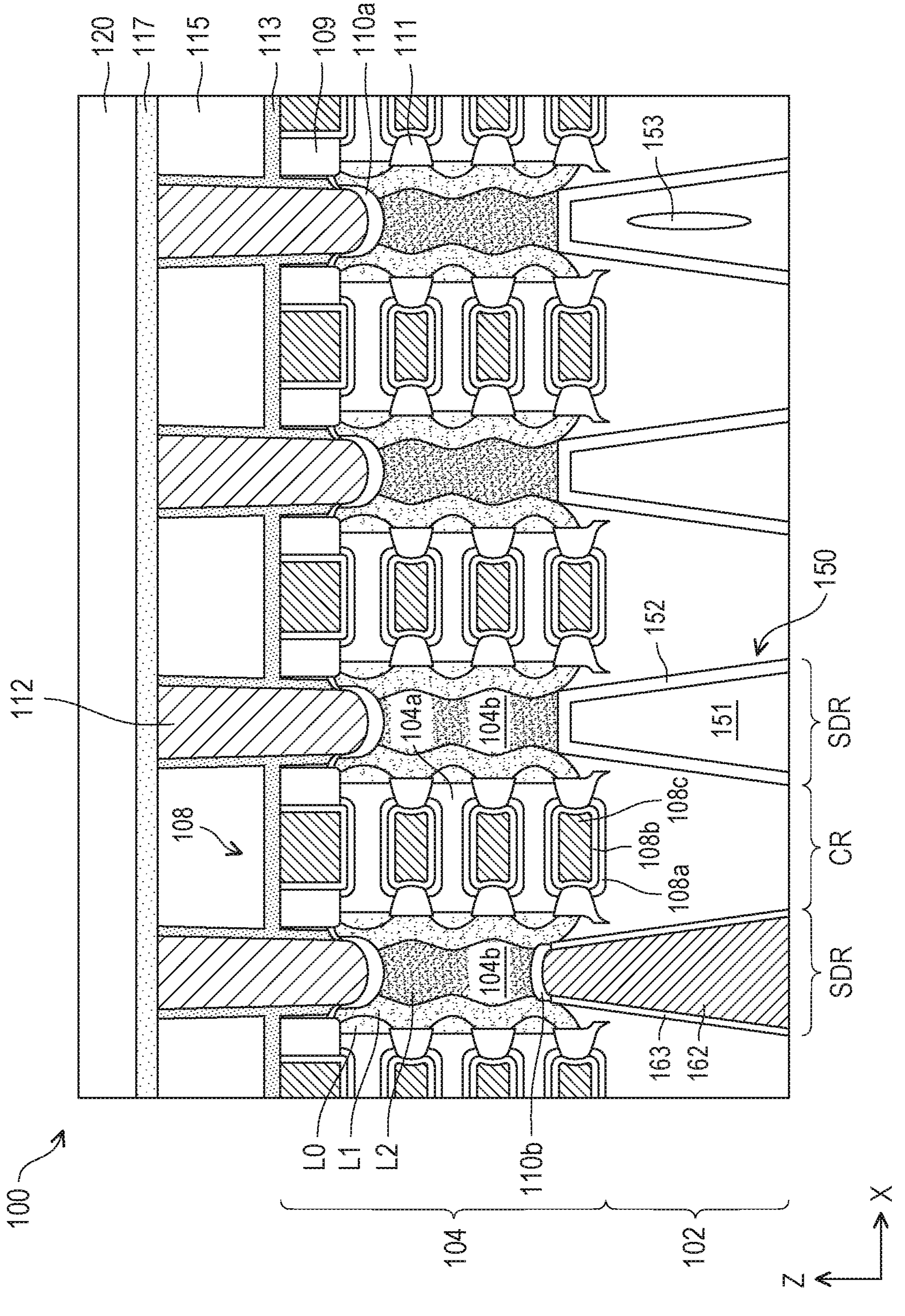

FIG. 3 illustrates a cross-sectional view of a semiconductor device 100 cut along the lines A-A' in FIG. 1, according to another embodiment of the present disclosure. FIG. 3 is similar to FIG. 2 and the similar features will not be repeated again for the sake of brevity. The difference in FIG. 3 is the inclusion of a backside S/D contact 162 that replaced one of the backside dielectric plugs 150. As will be described below, the backside S/D contact 162 is formed from a backside of the semiconductor device 100. As shown, the backside S/D contact 162 is vertically aligned with the epitaxial S/D features 104*b* and the frontside S/D contacts 112. The backside S/D contact 162 horizontally spans between gate structures 108 (or channel regions CR) and have a width equal to or smaller than a width of the epitaxial S/D features 104*b* along the x direction. In an embodiment, the backside S/D contact 160 has substantially a same width as the frontside S/D contacts 112. The backside S/D contact 162 penetrates through and is surrounded by the semiconductor substrate 102. A top surface of the backside S/D contact 162 is above a bottom surface of the gate structures 108. The backside S/D contact 162 electrically connects to one of the epitaxial S/D features 104*b*. Like the frontside S/D contacts 112, the backside S/D contact 162 may include titanium (Ti), ruthenium (Ru), copper (Cu), nickel (Ni), cobalt (Co), tungsten (W), tantalum (Ta), or molybdenum (Mo). In an embodiment, backside silicide features 110*b* are first formed under the epitaxial S/D features 104*b*, then the backside S/D contact 162 is formed under the silicide features 110*b*. The silicide features 110*b* may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In the embodiment shown, the backside S/D contact 162 is surrounded by a barrier layer 163. The barrier layer 163 reduces oxidation and diffusion defects between the semiconductor substrate 102 and the S/D contact 162. The barrier layer 163 may include silicon nitride. The S/D contact 162 directly contacts the bottom surface of the epitaxial S/D feature 104*b* (or silicide feature 110*b*). Described in another way, the S/D contact 162 and the barrier layer 163 may collectively be referred to as an S/D contact that includes a metal fill surrounded by a barrier layer (analogous to the backside dielectric plugs 150 having a dielectric fill layer 151 surrounded by a barrier layer 152).

Figure 4:
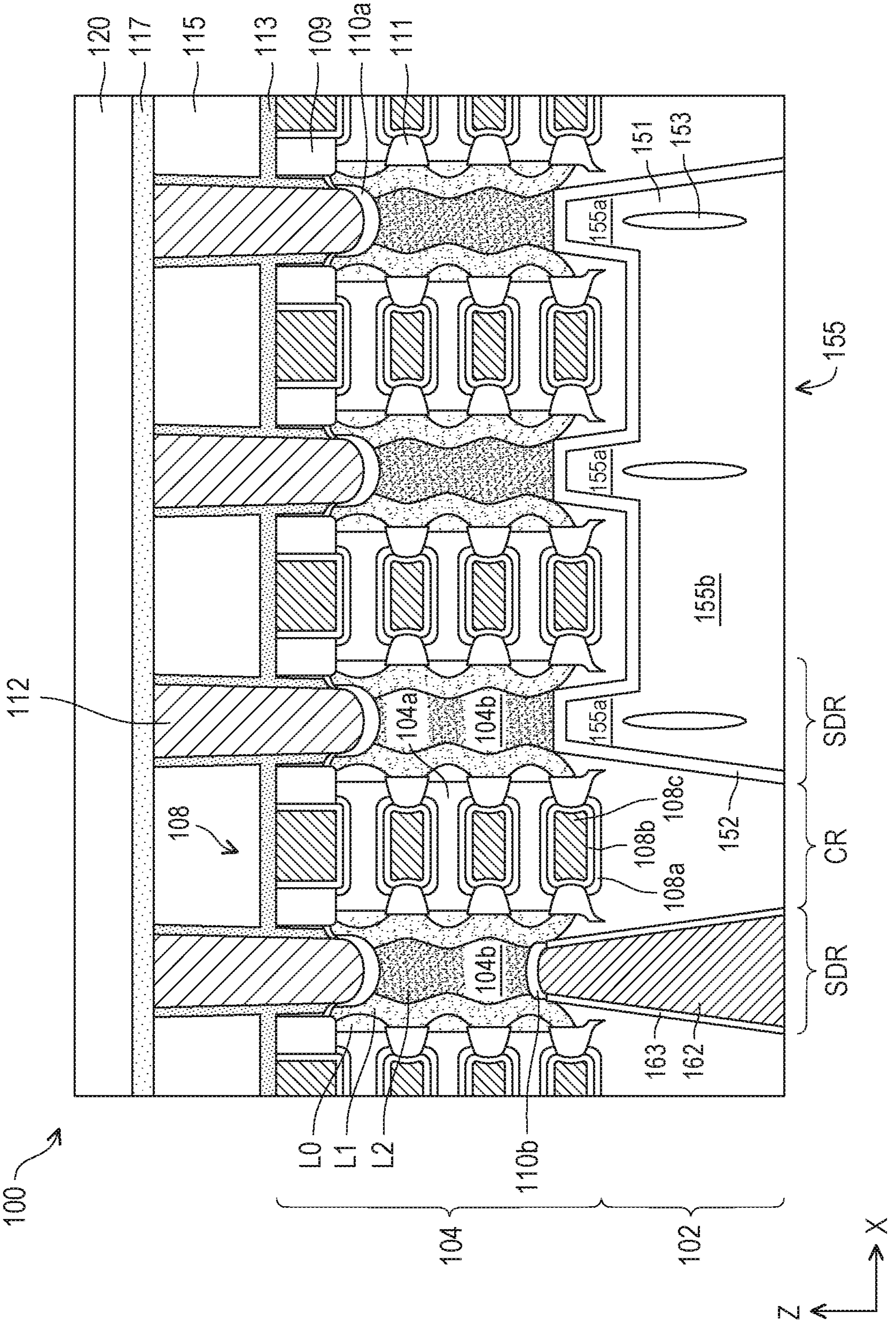

FIG. 4 illustrates a cross-sectional view of a semiconductor device 100 cut along the lines A-A' in FIG. 1, according to another embodiment of the present disclosure. FIG. 4 is similar to FIG. 3 and the similar features will not be repeated again for the sake of brevity. The difference in FIG. 4 is that the backside dielectric plugs 150 in FIG. 3 are connected to each other to form an extended dielectric plug 155. As will be described below, the extended dielectric plug 155 is formed from a backside of the semiconductor device 100 and a variation of the backside dielectric plugs 150. As shown, the extended dielectric plug 155 includes multiple penetrating portions 155*a* that are vertically aligned with the epitaxial S/D features 104*b* and the frontside S/D contacts 112. The penetrating portions 155*a* horizontally spans between gate structures 108 (or channel regions CR) and have a width equal to or smaller than a width of the epitaxial S/D features 104*b* along the x direction. The extended dielectric plug 155 further includes a bulk portion 155*b* from which the penetrating portions 155*a* protrude from. The bulk portion 155*b* horizontally spans across a width of multiple epitaxial S/D features 104*b* and/or channel regions CR. The penetrating portions 155*a* have top surfaces above bottom surfaces of each of the gate structures 108, and the bulk portion 155*b* have top surfaces below bottom surfaces of each of the gate structures 108. The extended dielectric plug 155 may include silicon oxide, silicon nitride, a low-k dielectric material, or a combination thereof. In the embodiment shown, the extended dielectric plug 155 includes a barrier layer 152 surrounding a dielectric fill layer 151. The barrier layer 152 may reduce oxidation defects between the semiconductor substrate 102 and the dielectric fill layer 151. The barrier layer 152 may include silicon nitride, and the dielectric fill layer 151 may include silicon oxide or a low-k dielectric material. The barrier layer 152 directly contacts the bottom surface of the epitaxial S/D features 104*b*. Although the barrier layer 152 may be included as part of the extended dielectric plug 155, the present disclosure is not limited thereto. For example, in some embodiments, the extended dielectric plug 155 does not include the barrier layer 152 and only includes the dielectric fill layer 151, where the dielectric fill layer 151 includes silicon nitride, silicon oxide, or a low-k dielectric material. In further embodiments, the extended dielectric plug 155 may include one or more air gaps 153 for further improvements to parasitic capacitance reduction.

Figure 5:
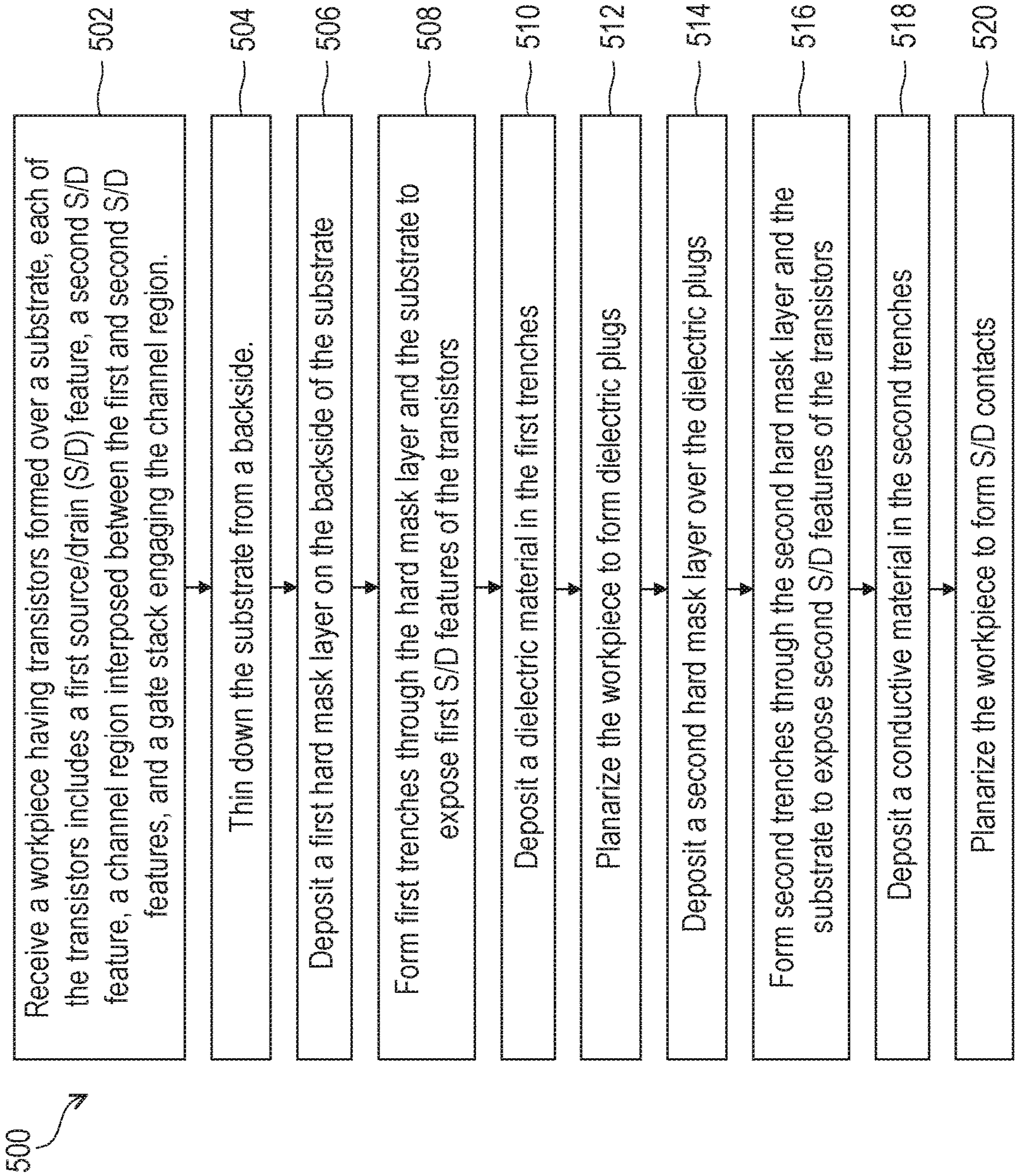
FIG. 5 is a flow chart of a method to form a semiconductor device having one or more backside dielectric plugs, in portion or in entirety, according to an embodiment of the present disclosure.

FIG. 5 is a flow chart of a method 500 to form a semiconductor device 100 having one or more backside dielectric plugs 150. The method 500 is described in conjunction with FIGS. 6-16, which depicts cross-sectional views of a semiconductor device 100 cut along the lines A-A' in FIG. 1 at intermediate stages of fabrication and processed in accordance with the method 500.

Figure 6:
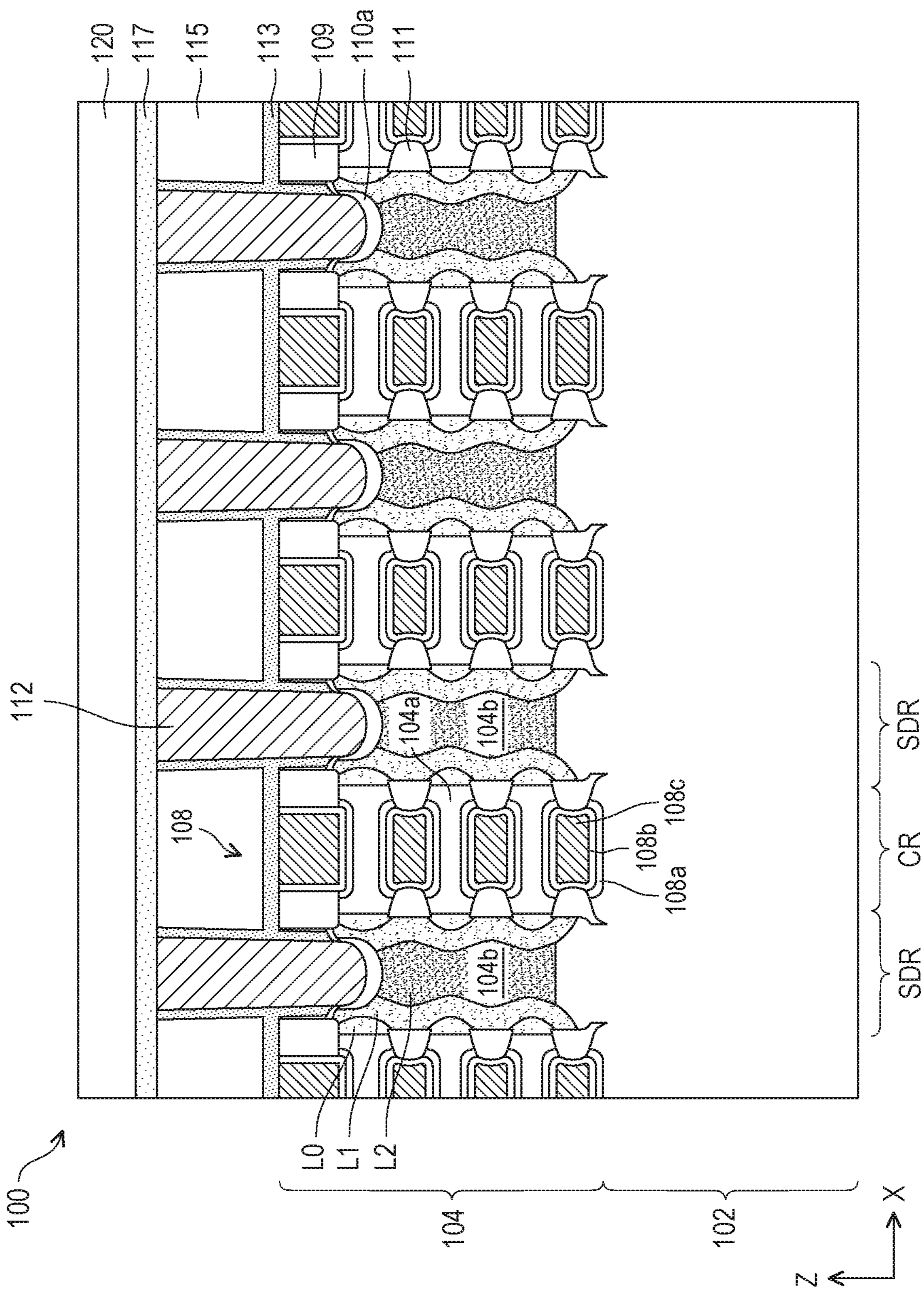
FIGS. 6-16 illustrate cross-sectional views of a semiconductor device cut along the lines A-A' in FIG. 1 at intermediate stages of fabrication and processed in accordance with the method of FIG. 5, according to an embodiment of the present disclosure.

Referring now to FIG. 6, the method 500 at operation 502 receives a workpiece having a fin active region 104 formed over a semiconductor substrate 102, and several gate structures 108 formed over channel regions (CR) of the fin active region 104. The fin active region 104 and the gate structures 108 forms one or more transistors over a substrate, each of the transistors includes a first S/D feature 104*b*, a second S/D feature 104*b*, a channel region CR having one or more transistor channels 104*a* interposed between the first and second S/D features 104*b*, and a gate structure 108 (or gate stack) engaging the channel region. These and related features have been described previously and will not be repeated again for the sake of brevity. Note that at operation 502, the method may further include receiving (or performing frontside processes to form) additional frontside IC features such as frontside S/D contacts 112 landing on the front surfaces of the S/D features 104*b* and one or more interconnect structures 120 over the frontside S/D contacts 112.

Figure 7:
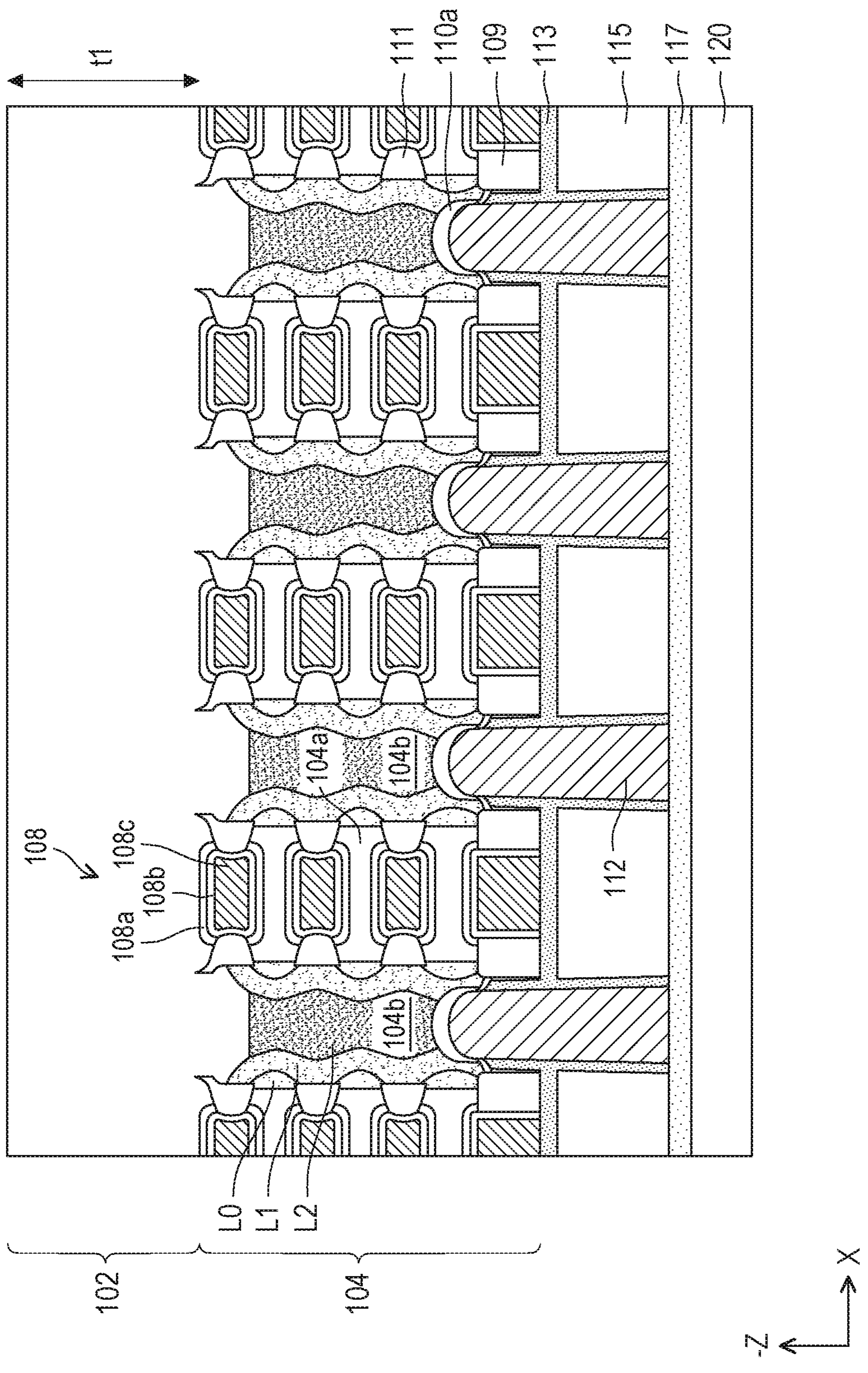

Referring now to FIG. 7, the method 500 at operation 504 thins down the substrate 102 from a backside. Operation 504 may be performed before or after the workpiece is flipped for further backside processing. In the present embodiment, the operation 504 includes flipping the workpiece and placing it on a carrier for structural support. Due to the flip, the axis facing vertically up is now shown as the –Z direction. Then, the operation thins down the exposed backside of the substrate 102 by a suitable process such as CMP. The workpiece may be placed on a carrier by any suitable attaching processes, such as direct bonding, hybrid bonding, using adhesive, or other bonding processes. The substrate may be thinned down by a mechanical grinding process and/or a chemical thinning process. In the present embodiment, the substrate 102 is thinned down to a thickness t1 ranging between about 10 nm to 50 nm.

Figure 8:
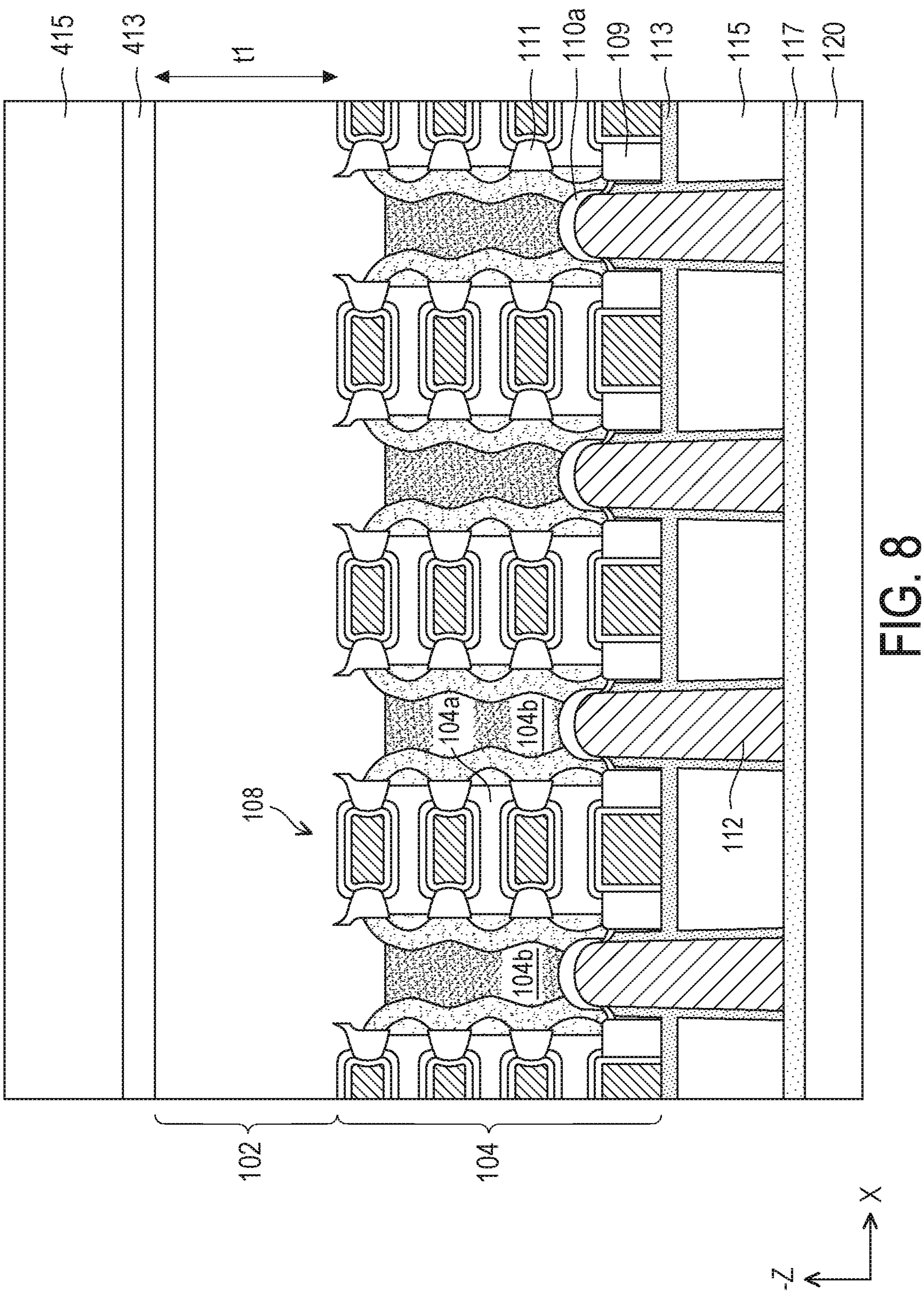

Referring now to FIG. 8, the method 500 at operation 506 deposits a first hard mask layer on the backside of the substrate 102 by any suitable deposition techniques such as chemical vapor deposition (CVD). In the present embodiment, the first hard mask layer includes a silicon nitride film 413 and a silicon oxide film 415. The silicon nitride film 413 is first deposited over a backside surface of the substrate 102, then the silicon oxide film 415 is deposited over the silicon nitride film 413. In an embodiment, the silicon nitride film 413 has a thickness between about 5 nm to about 15 nm, and the silicon oxide film 415 has a thickness between about 15 nm to about 45 nm. Note that in other embodiments, the first hard mask layer may include only the silicon nitride film 413 or the silicon oxide film 415.

Figure 9:
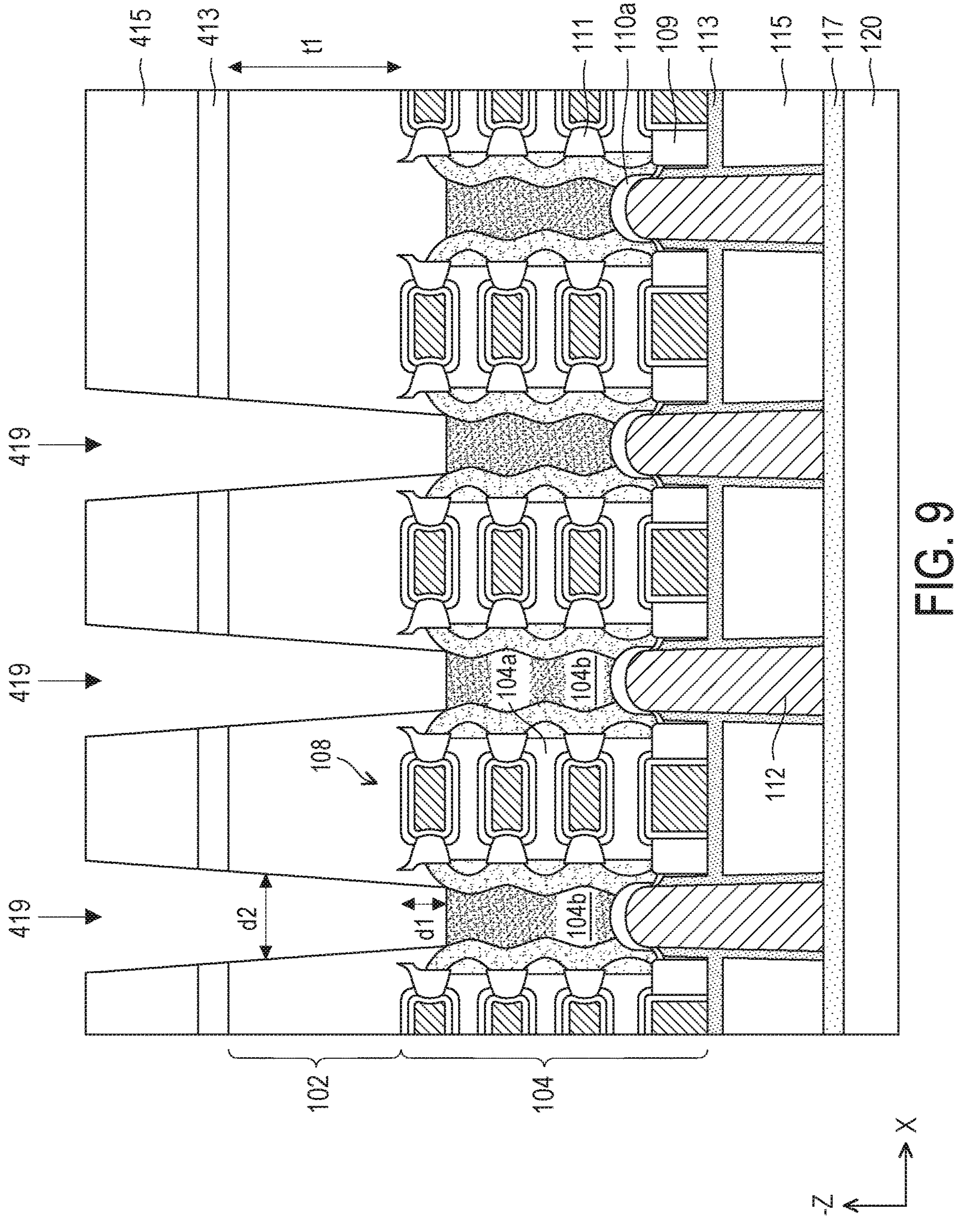

Referring now to FIG. 9, the method 500 at operation 508 forms first trenches 419 through the hard mask layer (e.g., the silicon nitride and oxide films 413 and 415) and the substrate 102 to expose first S/D features 104*b* of the transistors. The operation 508 may include patterning the first hard mask layer through a photolithography process, thereby forming patterned hard masks exposing portions of the substrate 102 to be etched. Then, the operation 508 etches through the exposed portions of the substrate 102 using the patterned hard masks as an etch mask. The etching of the substrate 102 may include dry etching, wet etching, reactive ion etching, or other suitable etching. Note that the etching may include intentional over-etching into the fin active region 104. Specifically, the first S/D features 104*b* may be partially recessed so that the later formed dielectric plugs has improved reduction of parasitic capacitance. In an embodiment, the first S/D features 104*b* may be recessed by a distance d1 ranging between about 5 nm to about 15 nm. In other words, a vertical distance between the recessed exposed surface of the first S/D features 104*b* and the bottom surface of the gate structure 108 is between about 5 nm to about 15 nm. The range for the distance d1 is not trivial. If the distance d1 is less than 5 nm, the reduction in parasitic capacitance may be negligible, but if the distance d1 is greater than 15 nm, there is risk of adversely affecting channel operations of the bottommost channels 104*a*. Still referring to FIG. 9, each the first trenches 419 may have a width d2 along the x direction ranging between about 5 nm to about 20 nm. The range for the distance d2 is not trivial. If the distance d2 is less than 5 nm, the reduction in parasitic capacitance may be negligible, but if the distance d2 is greater than 20 nm, there is risk of over-etching into and damaging the gate structures 108, and specifically the gate dielectric layers 108*b*.

Figure 10:
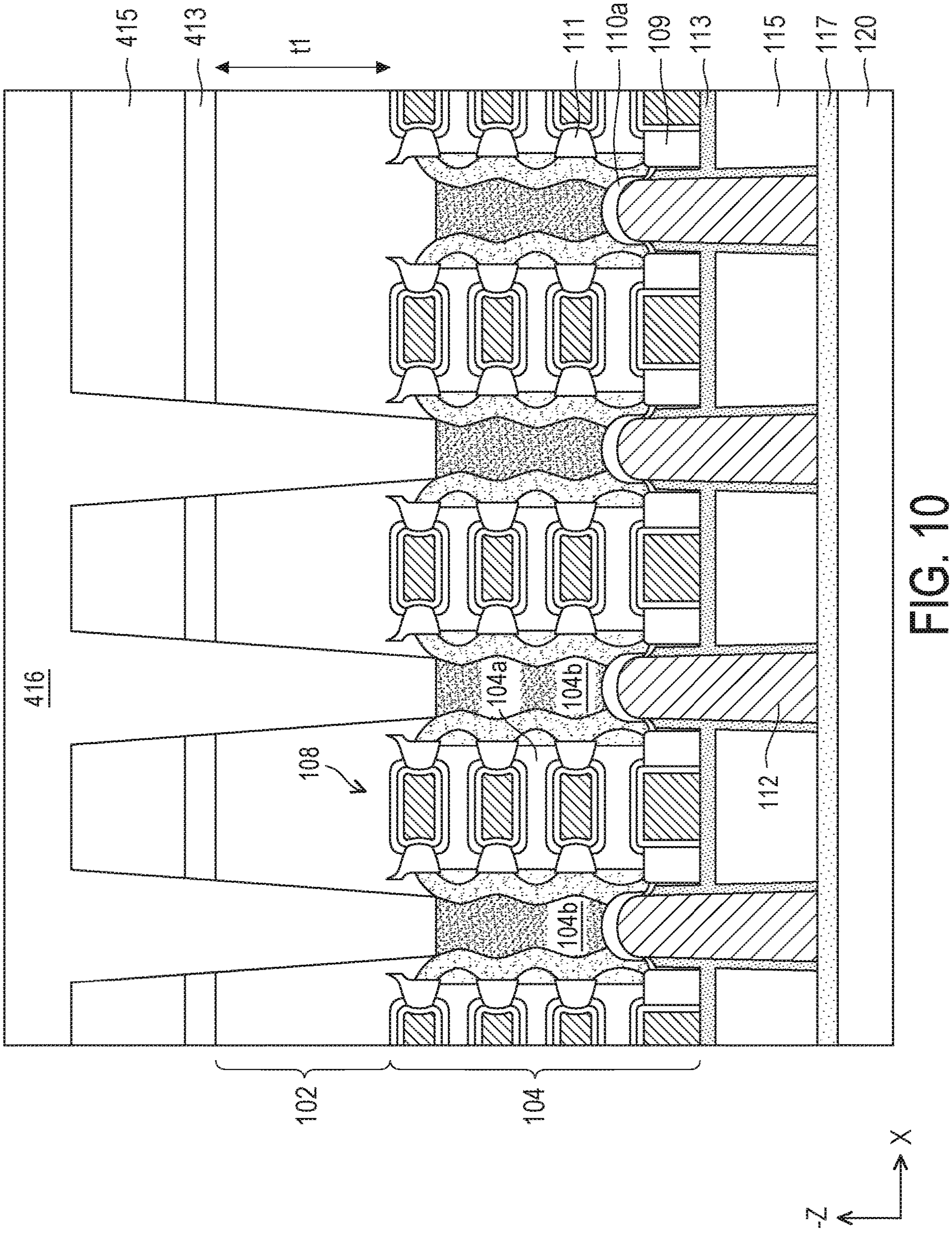

Referring now to FIG. 10, the method 500 at operation 510 deposits a dielectric material 416 into the first trenches 419 by any suitable deposition process. The dielectric material 416 may include silicon oxide, silicon nitride, a low-k dielectric material, or a combination thereof. The operation 510 may include first depositing a conformal barrier film into the first trenches 419, then depositing a dielectric fill material over the conformal barrier film. Such a process results in a barrier layer 152 and dielectric fill layer 151 shown in FIGS. 2-3. Alternatively, only a dielectric fill material is deposited into the first trenches 419. The deposition of the dielectric material 416 may be controlled such that air gaps 153 (not shown here but shown in FIGS. 2-3) are formed and surrounded by the dielectric material 416. For example, the deposition rate may be tuned to a higher rate to intentionally form voids in the first trenches 419. In a further embodiment, a porous dielectric material is deposited into the first trenches 419 to further facilitate trapped air. The air gaps 153 may provide further reduction of parasitic capacitance due to its low-k properties.

Figure 11:
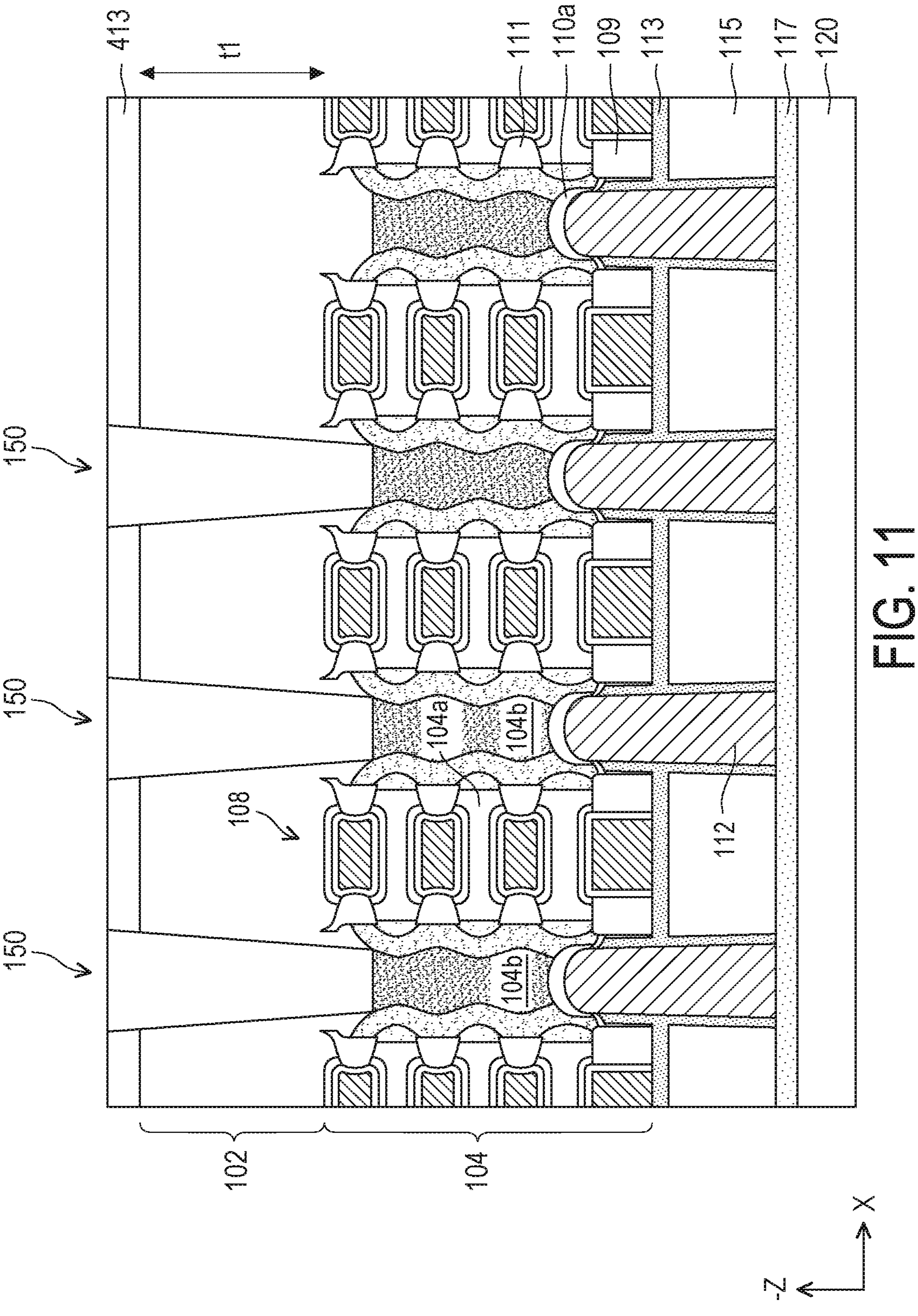

Referring now to FIG. 11, the method 500 at operation 512 planarizes the workpiece by a suitable process, such as dielectric CMP, to form dielectric plugs 150. The dielectric plugs 150 corresponds to the backside dielectric plugs 150 described with respect to FIGS. 2 and 3 and will not be described again for the sake of brevity. In the present embodiment, the workpiece is planarized such that the silicon oxide film 415 is removed and top surfaces of the dielectric plugs 150 are coplanar with top surfaces of the silicon nitride film 413. In another embodiment, the workpiece may be planarized such that the silicon nitride film 413 is also removed and top surfaces of the dielectric plugs are coplanar with top surfaces of the substrate 102.

Figure 12:
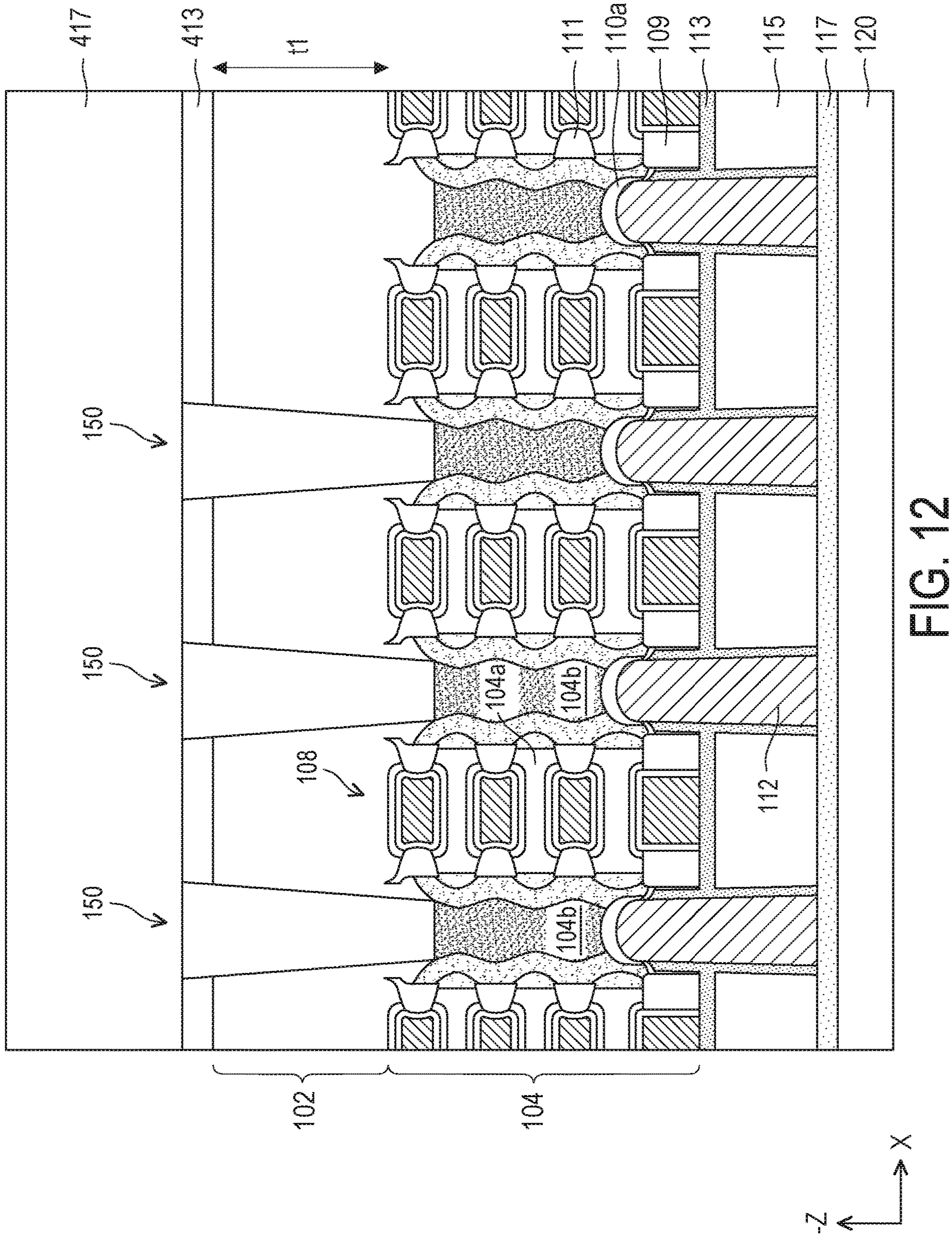
Figure 13:
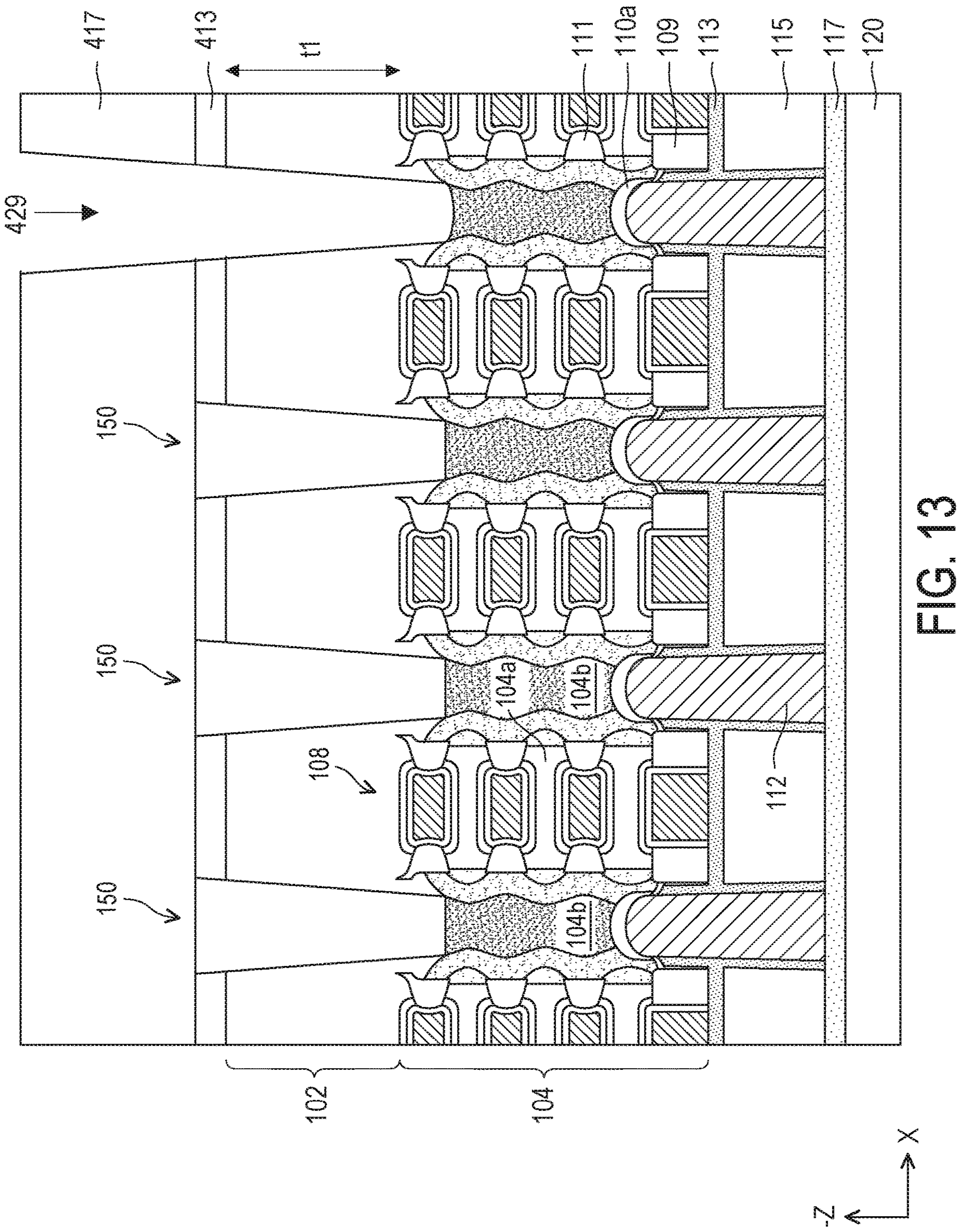

Referring now to FIG. 12, the method 500 at operation 514 deposits a second hard mask layer over the dielectric plugs 150 by any suitable deposition techniques such as chemical vapor deposition (CVD). The second hard mask layer may include another silicon nitride film (not shown) and another silicon oxide film 417. In the present embodiment, the second hard mask layer includes a silicon oxide film 417 and the silicon oxide film 413. In an embodiment where the silicon nitride film 413 is removed, the hard mask layer may include another silicon nitride film (not shown) and the silicon oxide film 417 over the another silicon nitride layer. In an embodiment, the silicon oxide film 417 has a thickness between about 15 nm to about 45 nm Referring now to FIG. 13, the method 500 at operation 516 forms second trenches 429 through the second hard mask layer (e.g., the silicon nitride and oxide films 413 and 417) and the substrate 102 to expose second S/D features 104*b* of the transistors. The operation 516 may include patterning the second hard mask layer through a photolithography process, thereby forming patterned hard masks exposing portions of the substrate 102 to be etched. Then, the operation 516 etches through the exposed portions of the substrate 102 using the patterned hard masks as an etch mask. The etching of the substrate 102 may include dry etching, wet etching, reactive ion etching, or other suitable etching. In the present embodiment, the depth and width of the second trenches 429 may be similar to the first trenches 419.

Figure 14:
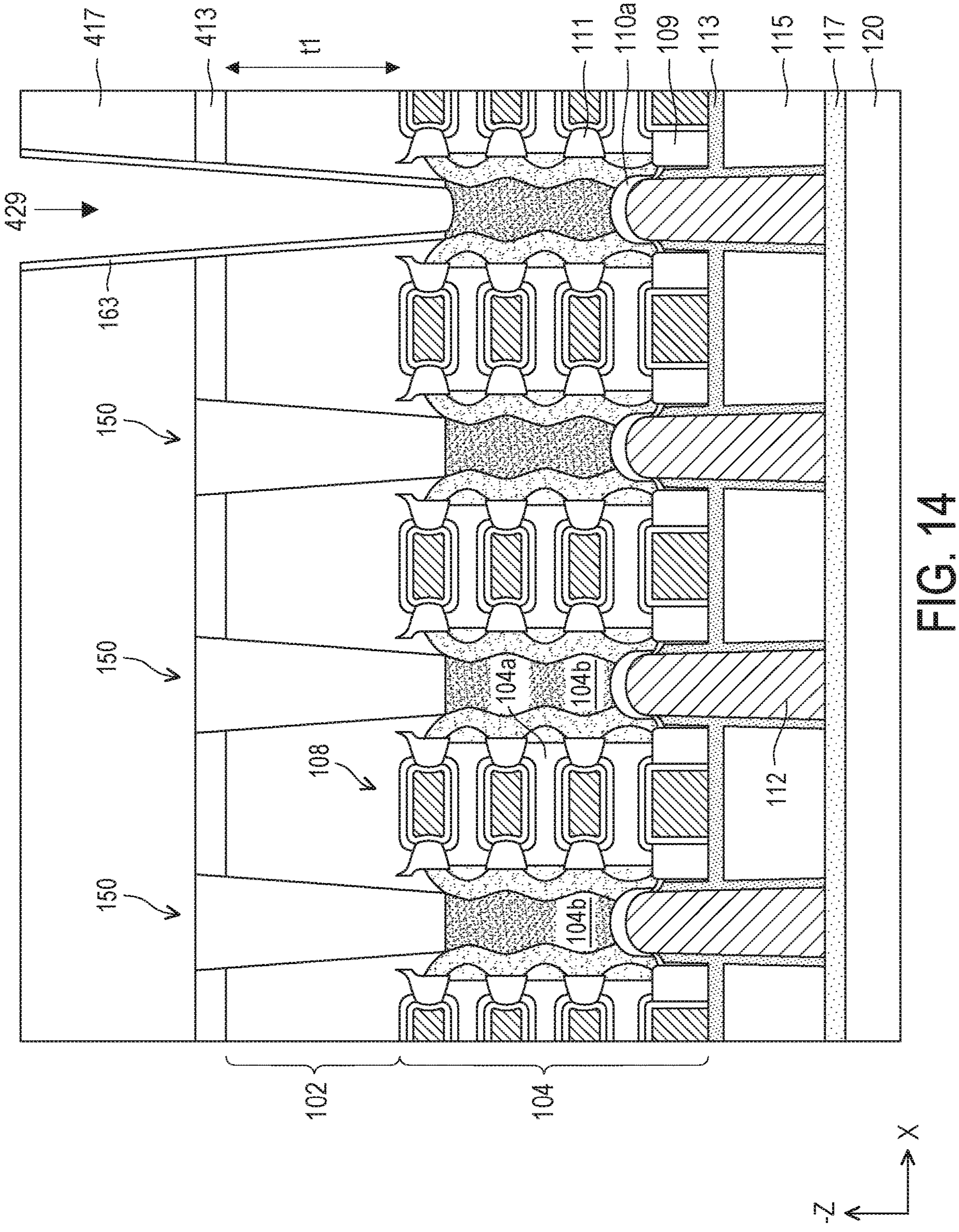
Figure 15:
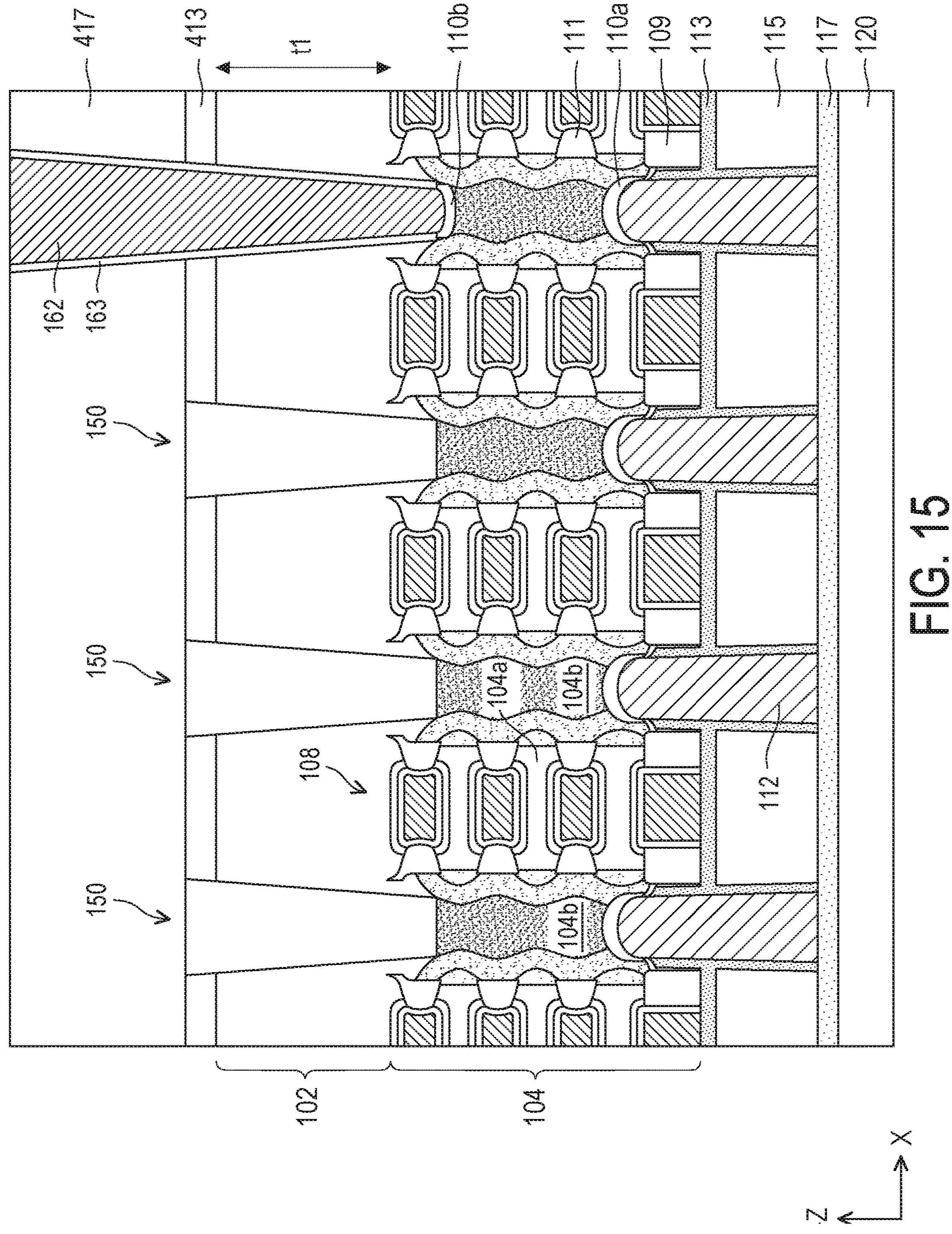
Figure 16:
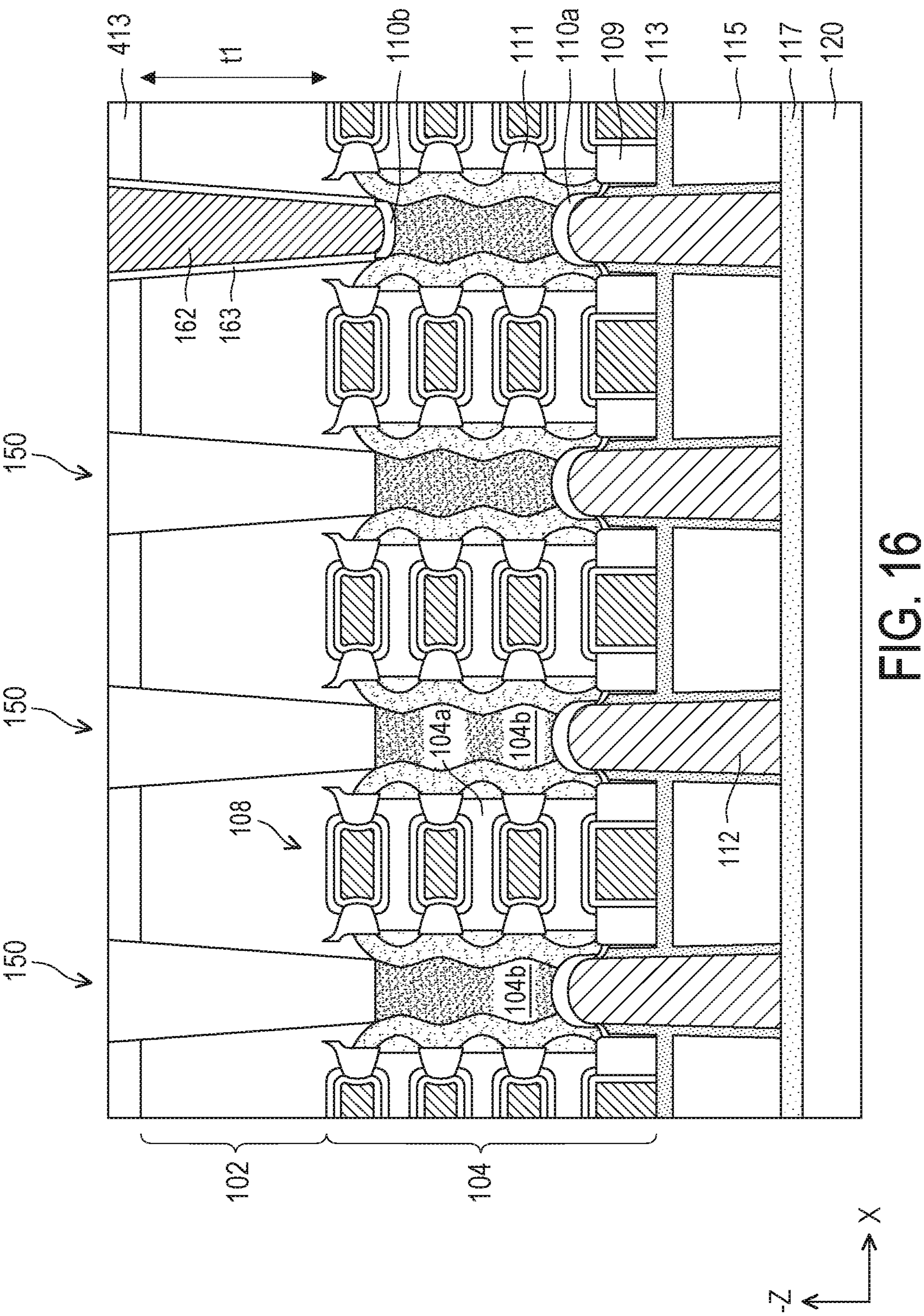

Referring now to FIGS. 14-16, the method 500 at operations 518 and 520 forms backside S/D contacts 162 in the second trenches 429. Specifically, the method at operation 518 deposits a conductive material into the second trenches 429, then the method at operation 520 planarizes the workpiece to form backside S/D contacts 162. Referring to FIG. 14, the operation 518 includes first depositing a barrier layer 163 into the second trenches 429 by a suitable deposition process then etching a horizontal portion of the barrier layer 163 to form a bottom opening that exposes a surface of the second S/D features 104*b*. Then, referring to FIG. 15, the operation 518 includes depositing a conductive material into the second trenches 429 and over the exposed surfaces of the second S/D features 104*b* to form backside S/D contacts 162. In an embodiment, silicide features 110*b* are first deposited over the exposed surfaces of the second S/D features 104*b* then a metal fill material is deposited over the silicide features 110*b*. Referring to FIG. 16, the workpiece is planarized by a suitable process such as CMP to reform the backside S/D contacts 162. In the present embodiment, the workpiece is planarized such that the silicon oxide film 417 is removed and top surfaces of the dielectric plugs 150, the silicon nitride film 413, and the backside S/D contacts 162 are coplanar. In another embodiment, the workpiece may be planarized such that the silicon nitride film 413 is also removed and top surfaces of the dielectric plugs 150, the backside S/D contacts 162, and the substrate 102 are coplanar. The silicide features 110*b*, the backside S/D contacts 162, and the barrier layer 163 have been previously described with respect to FIG. 3 and will not be described again for the sake of brevity. As shown, the backside of the S/D features 104*b* may either directly contact a dielectric plug 150 or a S/D contact 162, and the dielectric plugs and/or S/D contacts 162 are separated from each other by portions of the substrate 102. The method 500 may perform further steps to complete fabrication of the semiconductor device 100. Additional operations can be provided before, during, and after method 500, and some of the operations described can be moved, replaced, or eliminated for additional embodiments of method 500.

Figure 17:
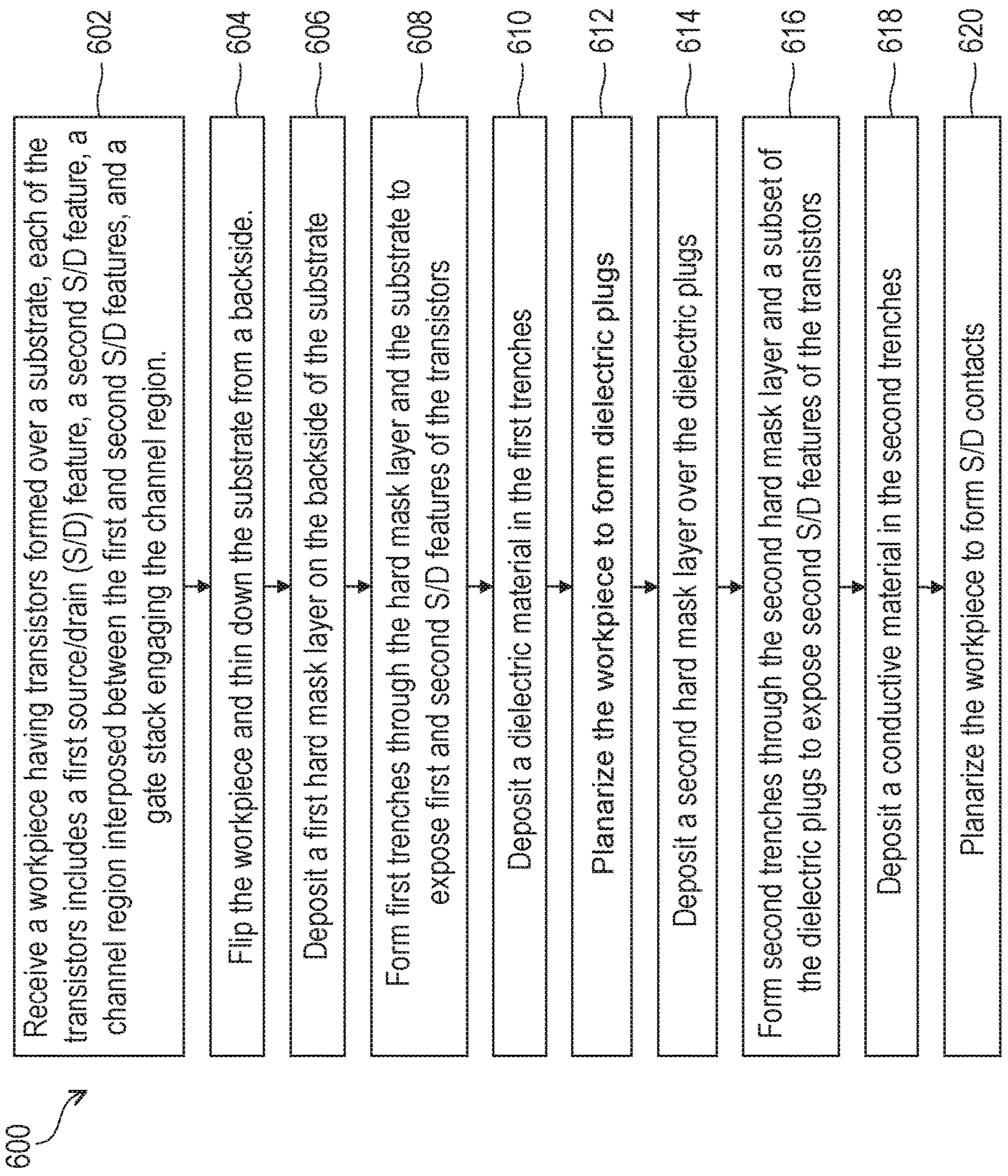
FIG. 17 is a flow chart of a method to form a semiconductor device having one or more backside dielectric plugs, in portion or in entirety, according to another embodiment of the present disclosure.
Figure 18:
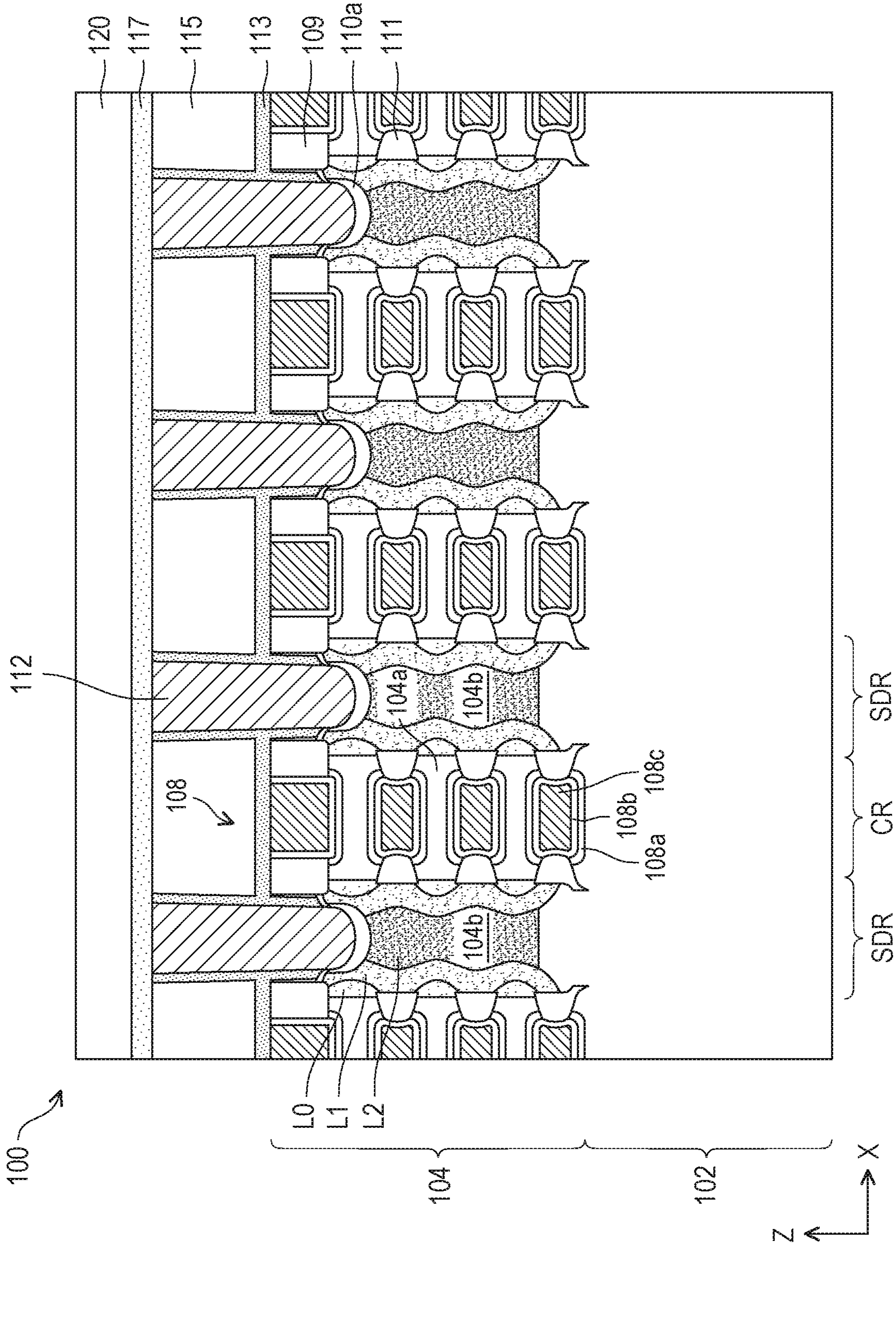
FIGS. 18-28 illustrate cross-sectional views of a semiconductor device cut along the lines A-A' in FIG. 1 at intermediate stages of fabrication and processed in accordance with the method of FIG. 17, according to an embodiment of the present disclosure.
Figure 19:
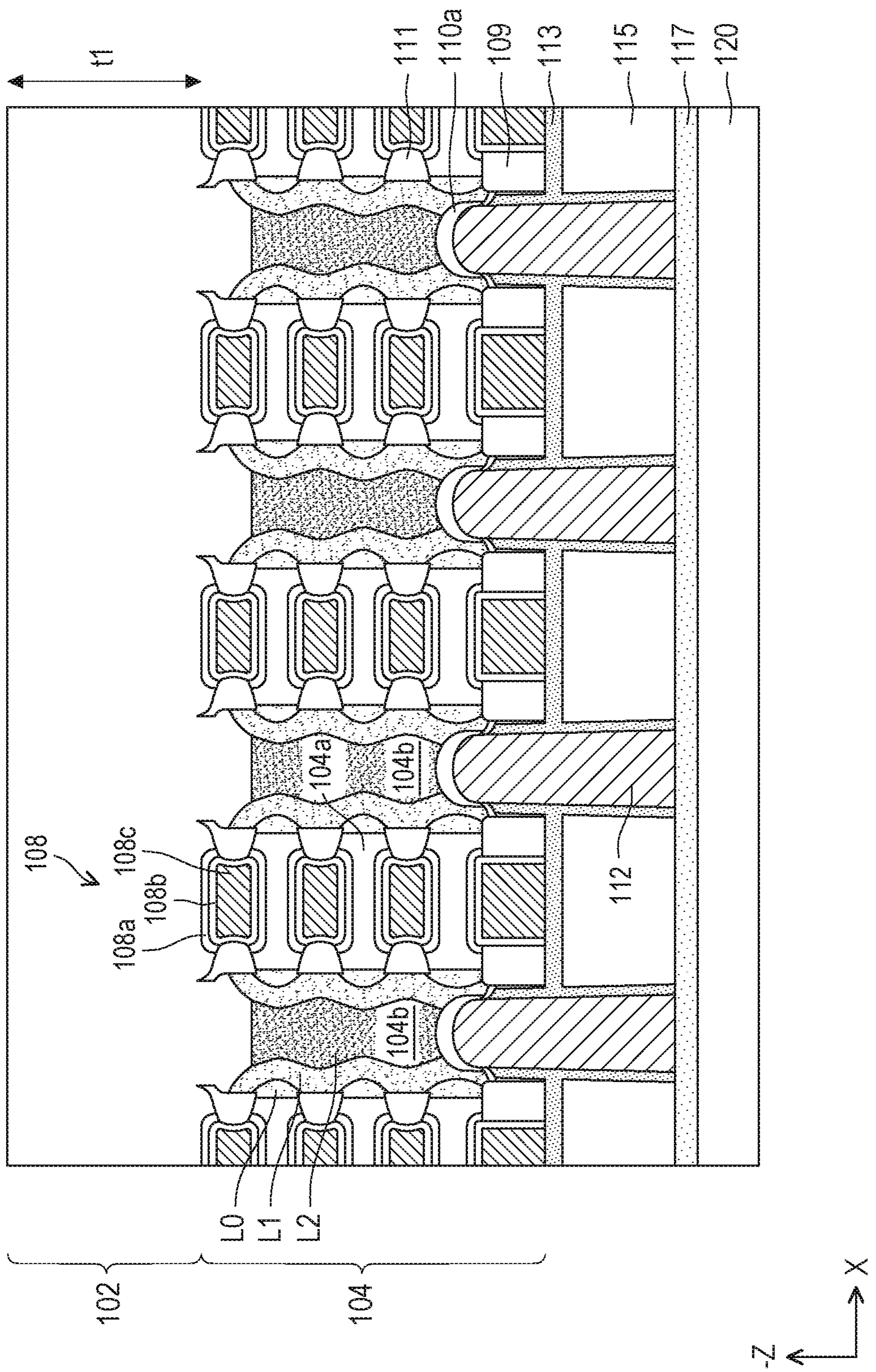
Figure 20:
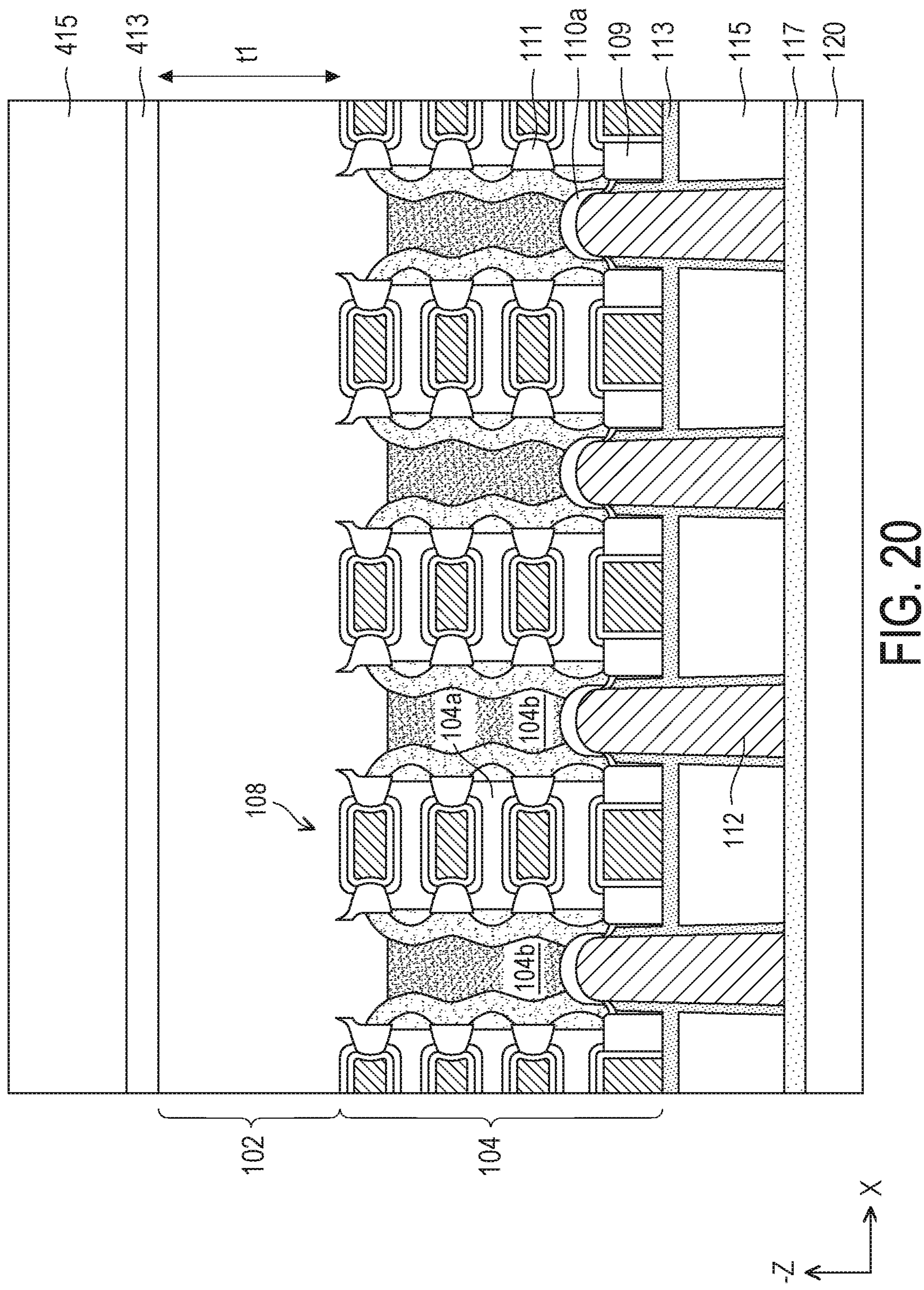

FIG. 17 is a flow chart of a method 600 to form a semiconductor device 100 having one or more backside dielectric plugs 150. The method 600 is described in conjunction with FIGS. 18-28, which depicts cross-sectional views of a semiconductor device 100 cut along the lines A-A' in FIG. 1 at intermediate stages of fabrication and processed in accordance with the method 600. Method 600 is similar to method 500 except that at operation 616, the second trenches 429 are formed through one or more of the dielectric plugs 150 and not through the substrate 102 like in operation 516 of method 500. Since method 600 is similar to method 500, only the differences will be described below.

Figure 25:
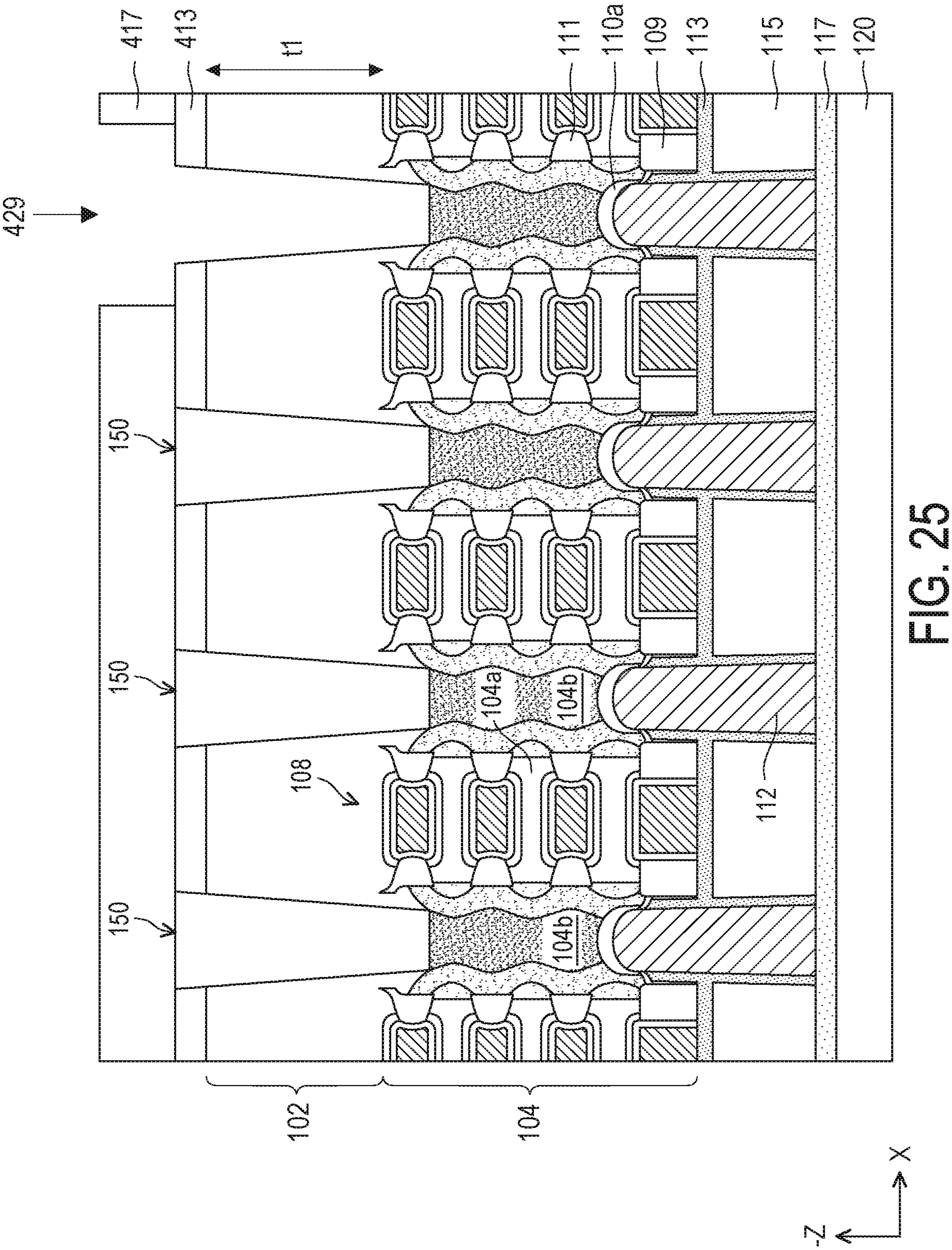
Figure 26:
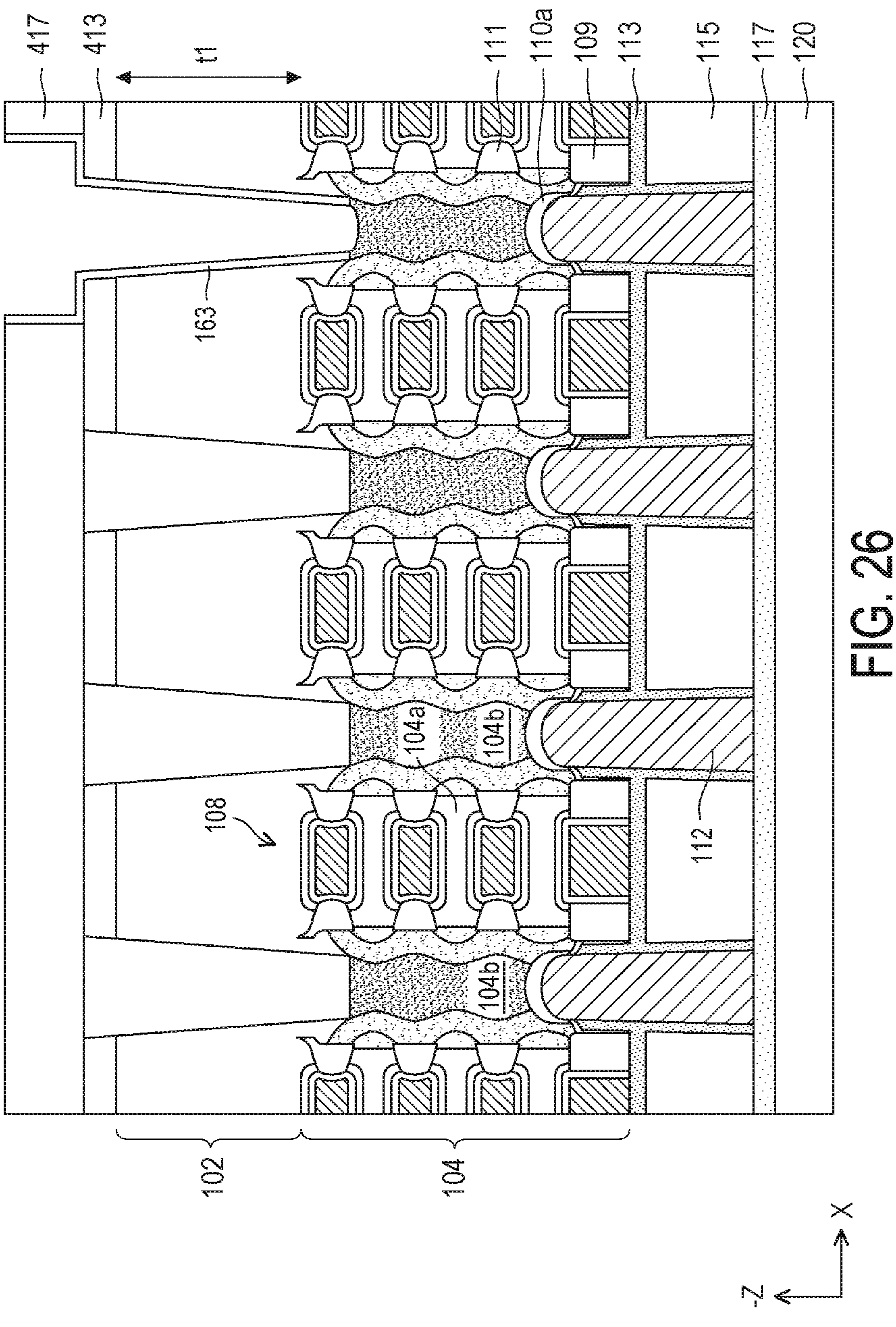
Figure 27:
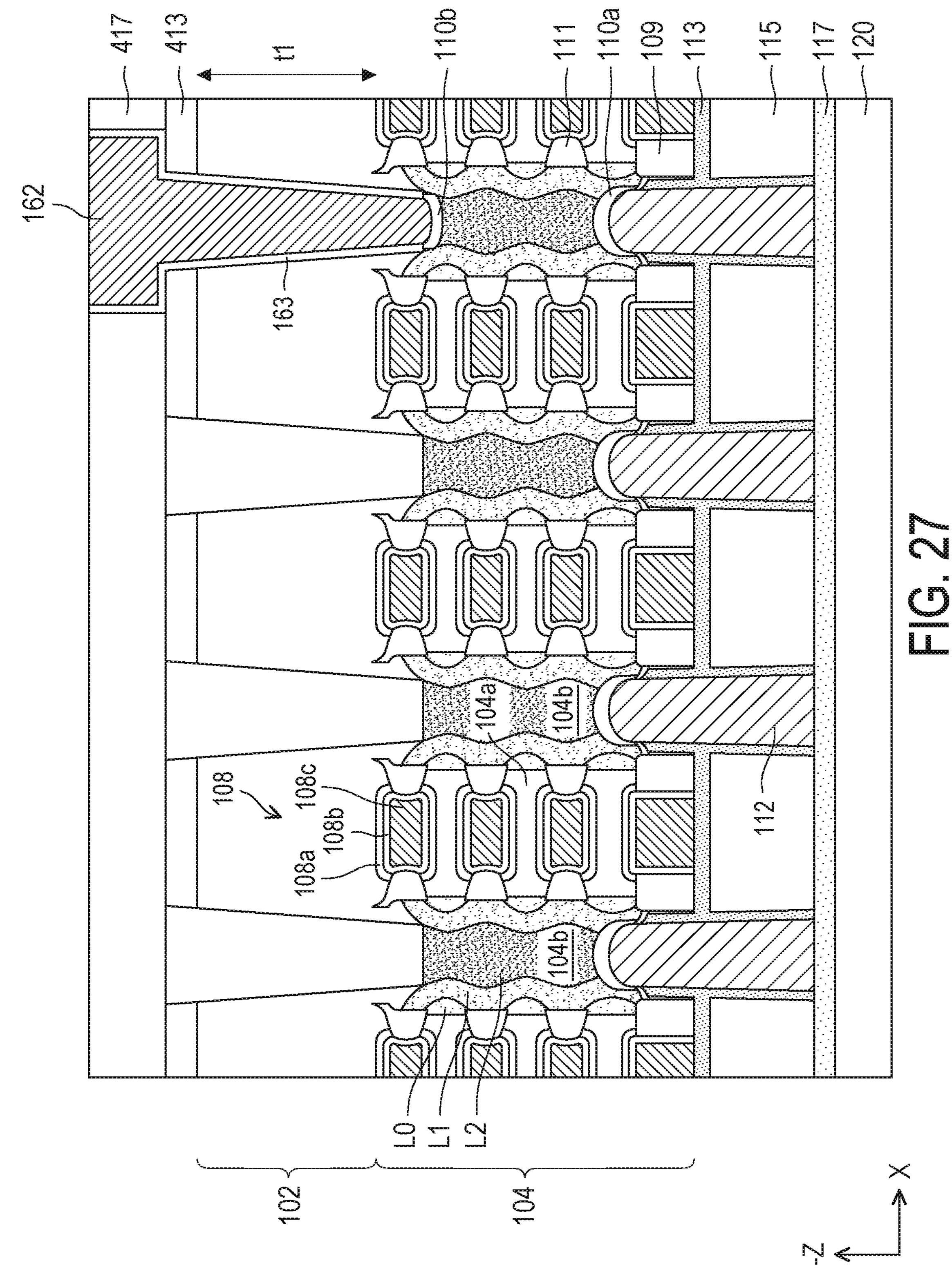
Figure 28:
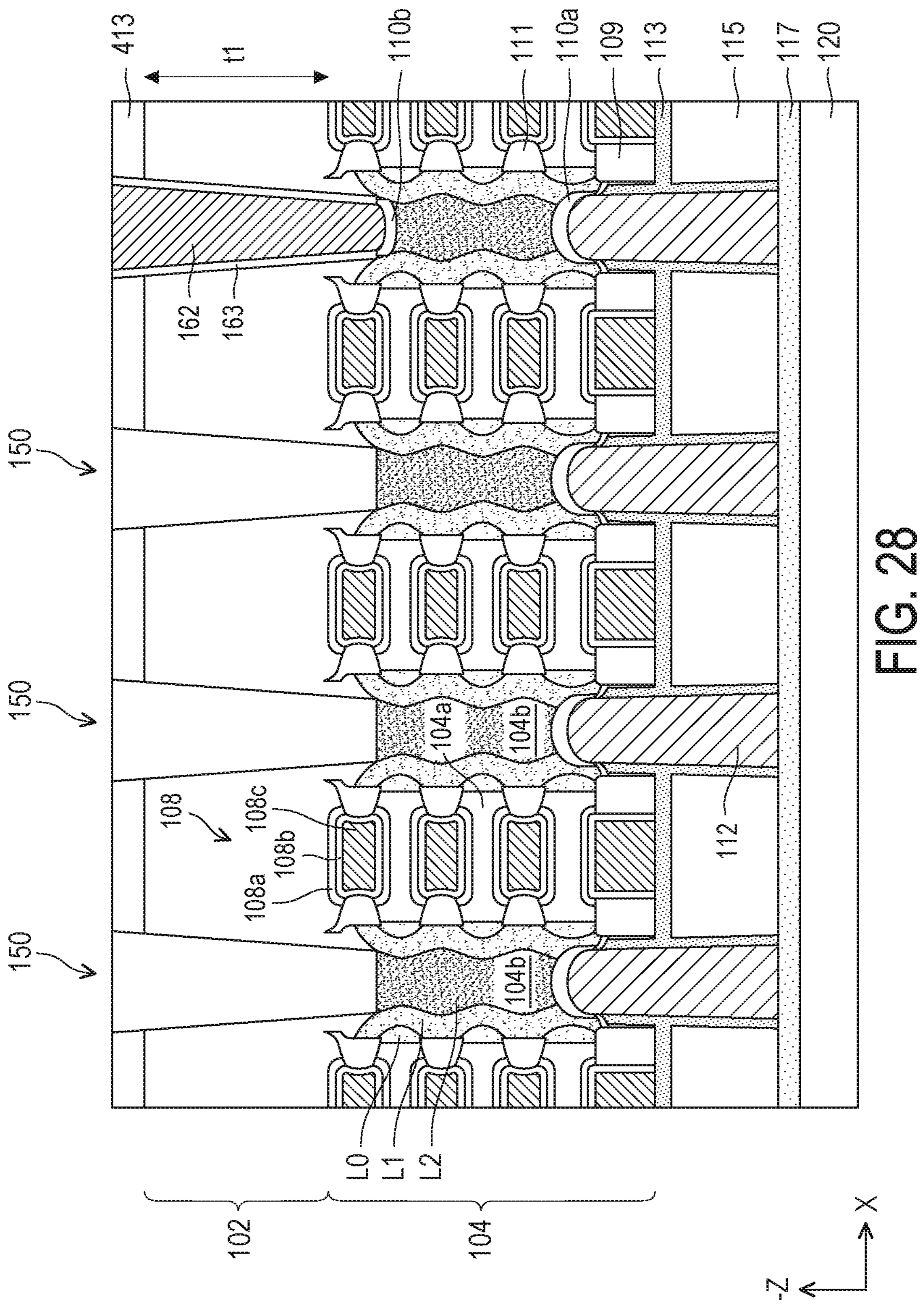

Referring now to FIGS. 18-24, the method 600 at operations 602-614 is similar to the method 500 at operations 502-514, respectively. The difference is that in method 600, backside dielectric plugs 150 are formed for both the first S/D features 104*b* (i.e., S/D features without backside S/D contacts 162) and the second S/D features 104*b* (i.e., S/D features with backside S/D contacts 162). In other words, there is full patterning and formation of backside dielectric plugs 150 for each of the S/D features 104*b* in the fin active region 104. Then, at operation 616, referring now to FIG. 25, the method 600 forms second trenches 429 through the second hard mask layer and a subset of the dielectric plugs 150 to expose second S/D features 104*b* of the transistors. Note that the advantage in method 600 is that at operation 616, a low resolution lithography process may be used to from the second trenches 429, thereby saving cost. This is because operation 616 involves etching through a dielectric plug 150 instead of the substrate 102. As such, there is etchant selectivity for self-alignment between the substrate 102 and the dielectric plug 150 when forming the second trenches 429. That is, the shape of the second trenches 429 will conform to the shape of the dielectric plug 150 previously formed. Therefore, any slight overlay error during the patterning process will not be an issue. As an example, FIG. 25 shows that the patterning opening may have margins larger in the x direction such that there may be a bigger opening in the hard mask layer (e.g., silicon oxide film 417) than an opening formed by etching through the dielectric plug 150. In an embodiment, the bigger opening is intentional to form a damascene backside power rail contact structure. Referring now to FIGS. 26-28, the remaining operation steps 618 and 620 are similar to the operation steps 518 and 520 and the method 600 forms the backside S/D contacts 162. In an embodiment, the backside S/D contacts 162 are formed to have a damascene contact structure like in FIG. 27. In this case, the planarization process in operation step 620 may be omitted.

Figure 29:
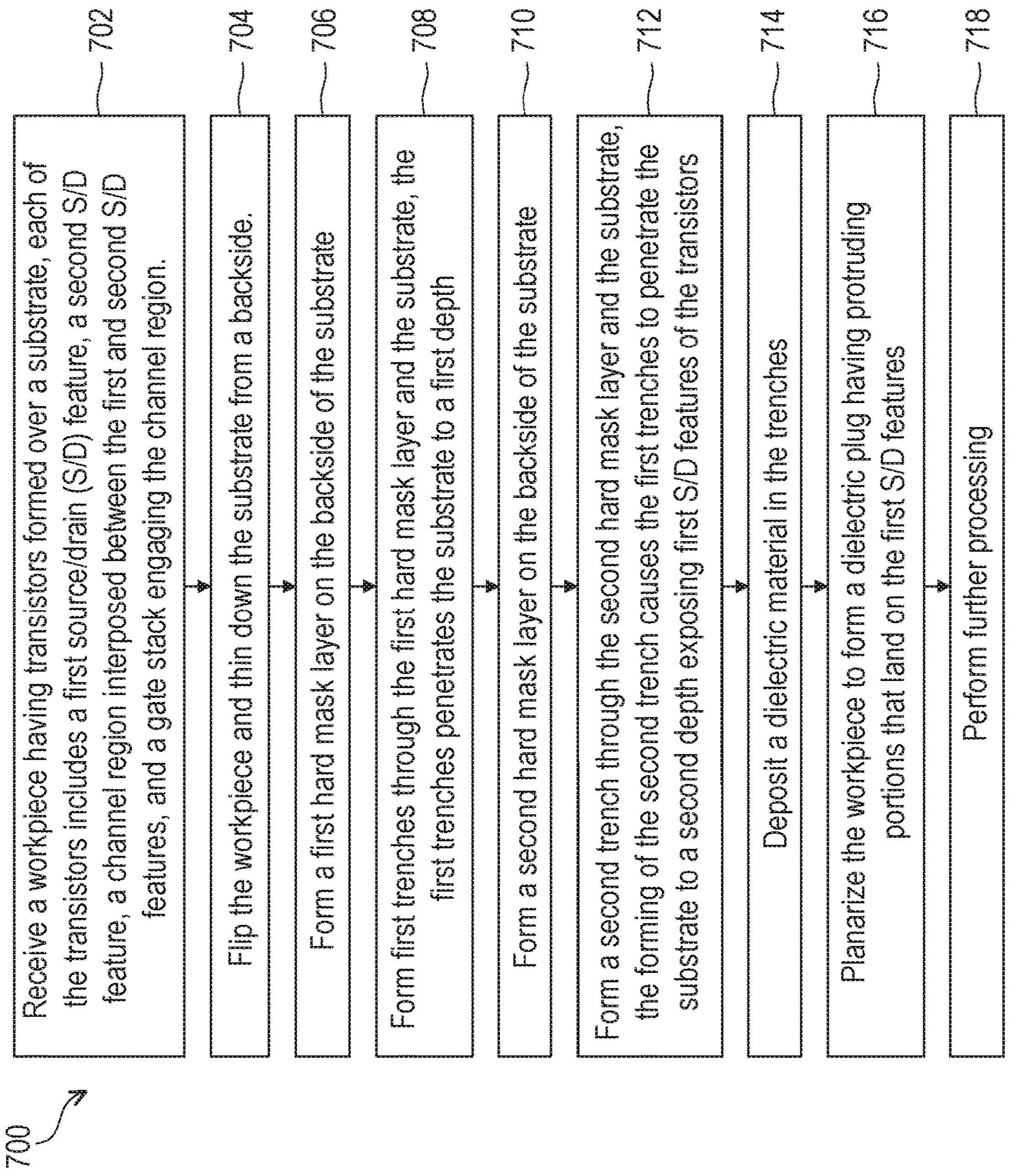
FIG. 29 is a flow chart of a method to form a semiconductor device having an extended backside dielectric plug, in portion or in entirety, according to another embodiment of the present disclosure.

FIG. 29 is a flow chart of a method 700 to form a semiconductor device 100 having an extended dielectric plug 155. The method 700 is described in conjunction with FIGS. 30-38, which depicts cross-sectional views of a semiconductor device 100 cut along the lines A-A' in FIG. 1 at intermediate stages of fabrication and processed in accordance with the method 700. Method 700 may have similar operation steps as methods 500 or 600 and only the differences will be described below. One difference is the inclusion of a dual-damascene process where the substrate 102 is patterned and etched in multiple steps. The dual-damascene process forms a trench having portions penetrating the substrate 102 at different depths.

Figure 21:
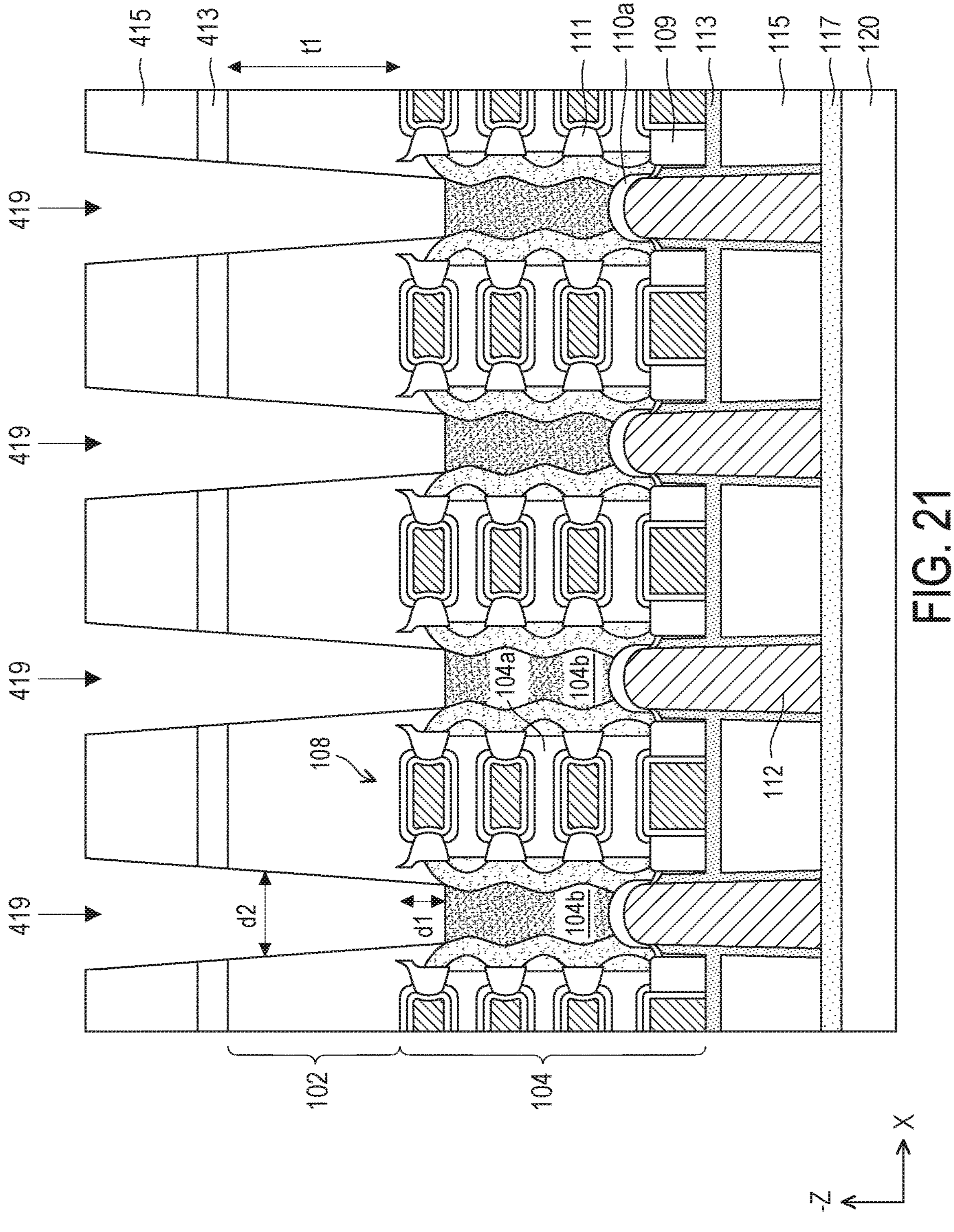
Figure 22:
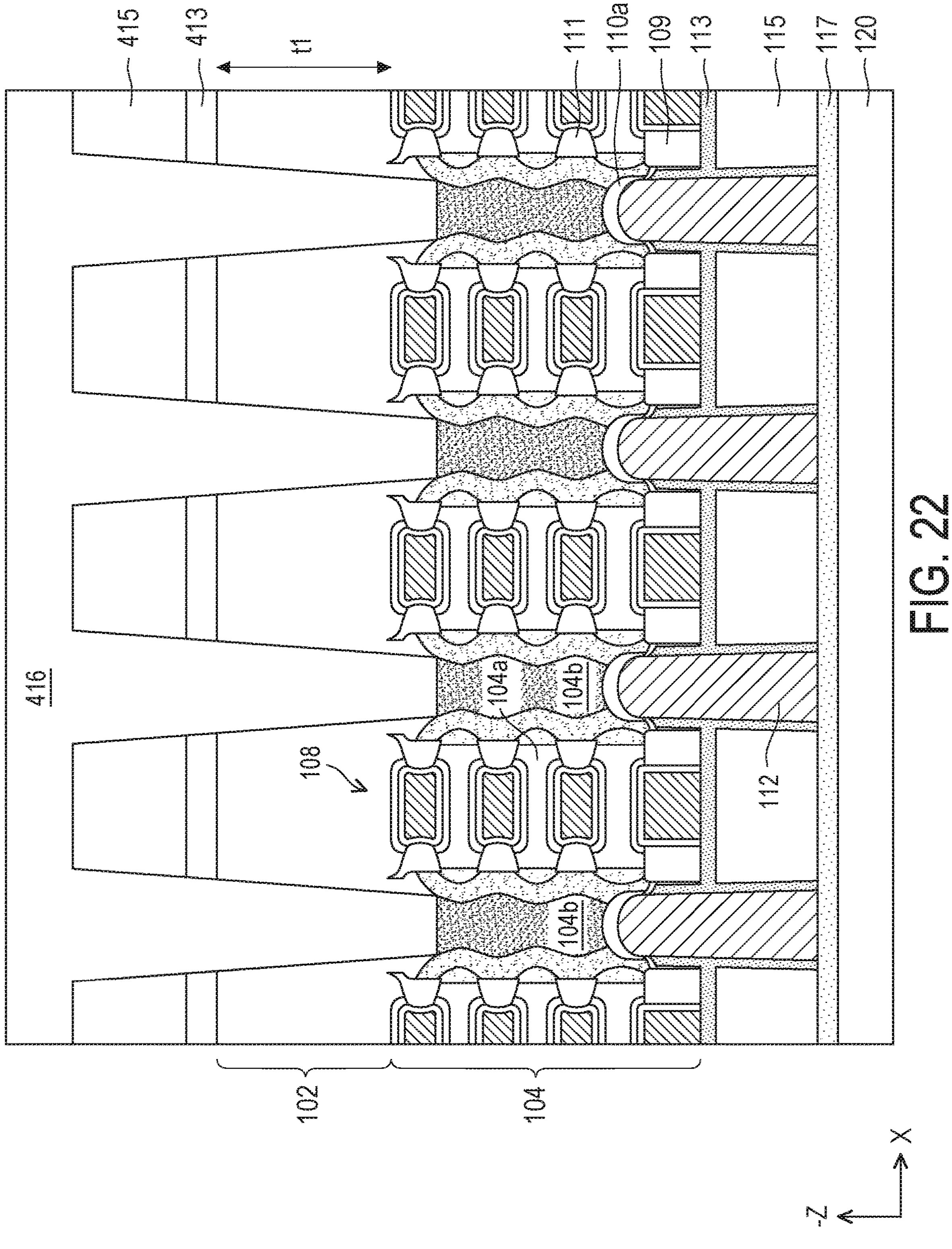
Figure 23:
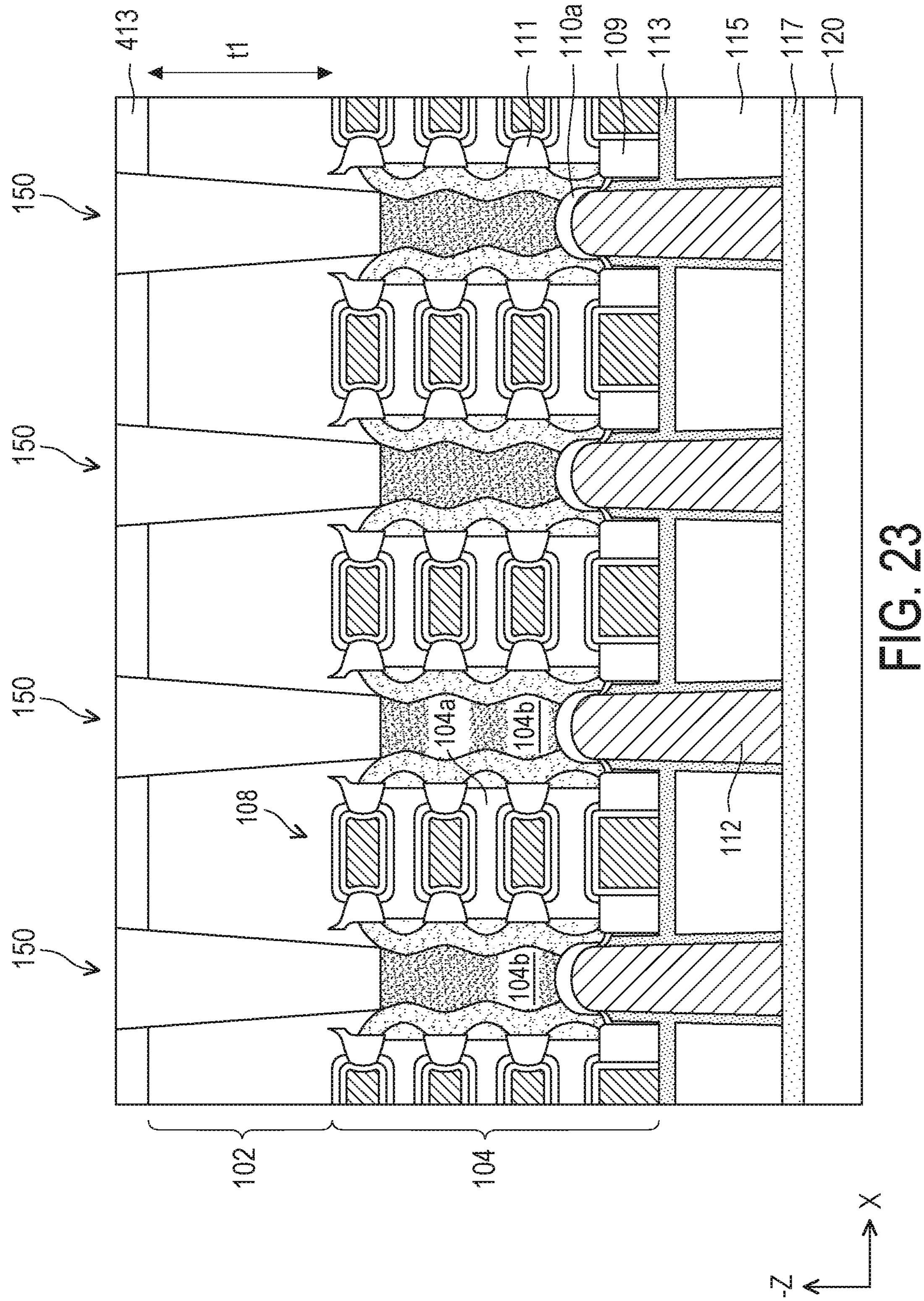
Figure 24:
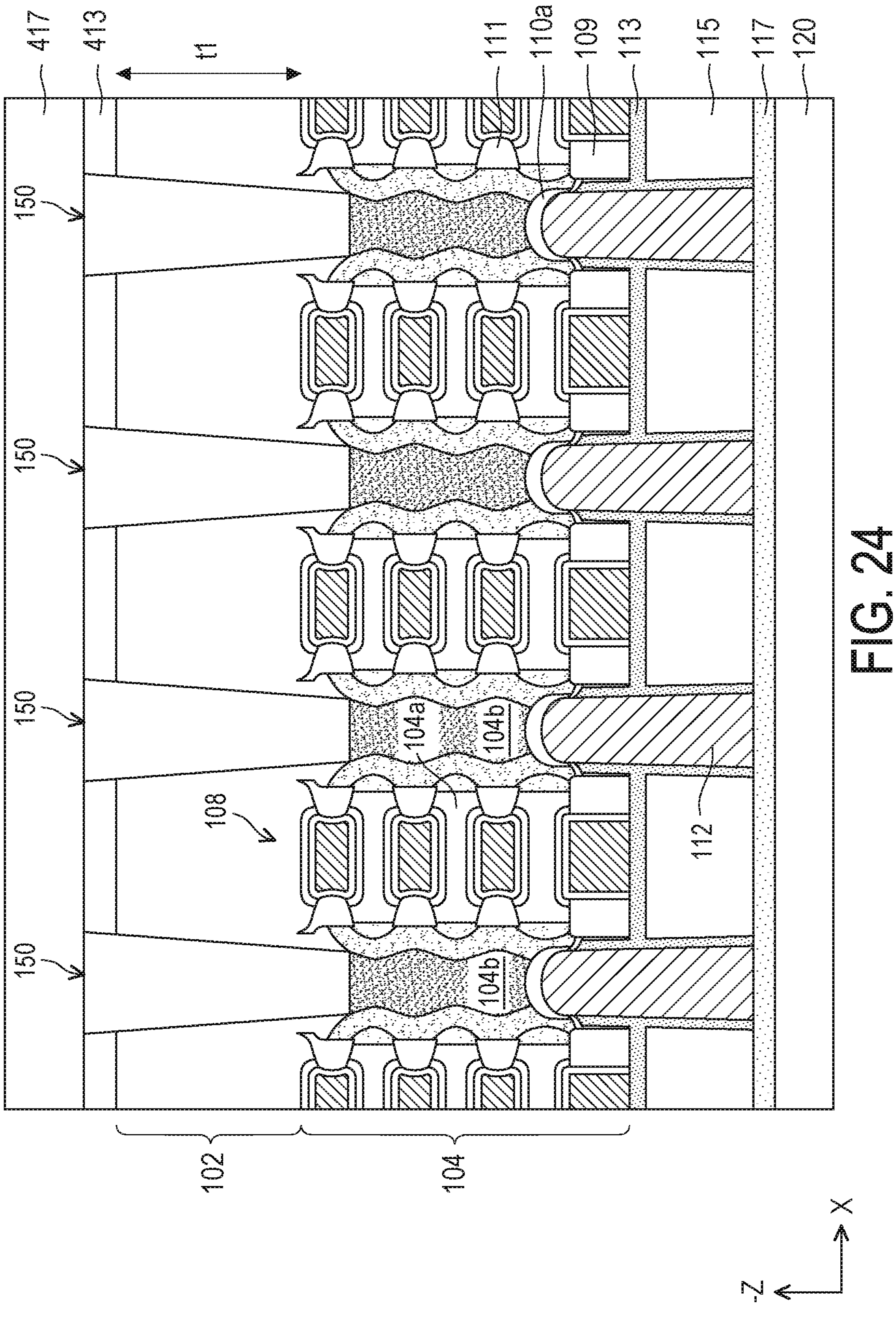
Figure 30:
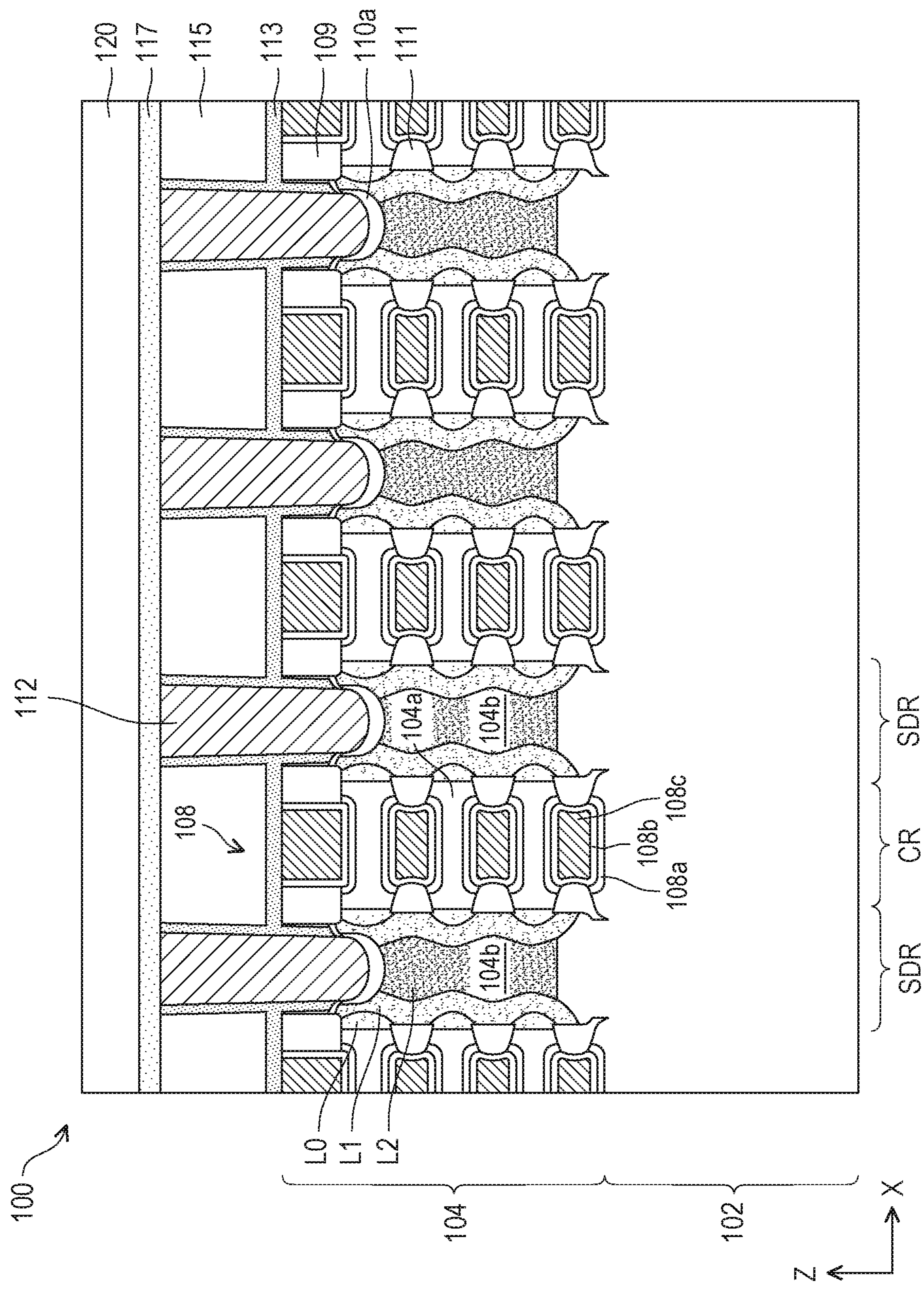
FIGS. 30-38 illustrate cross-sectional views of a semiconductor device cut along the lines A-A' in FIG. 1 at intermediate stages of fabrication and processed in accordance with the method of FIG. 29, according to an embodiment of the present disclosure.
Figure 31:
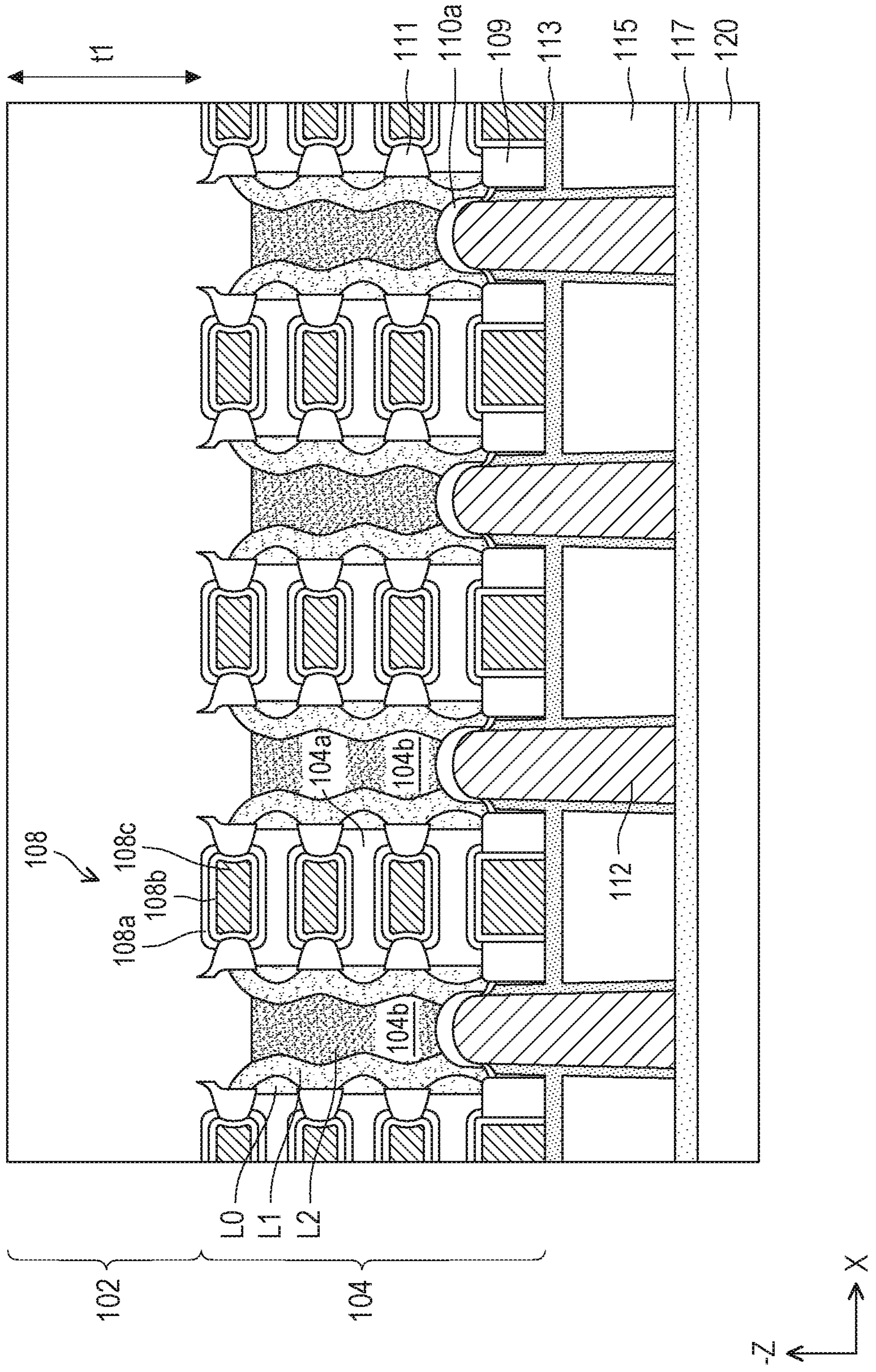
Figure 32:
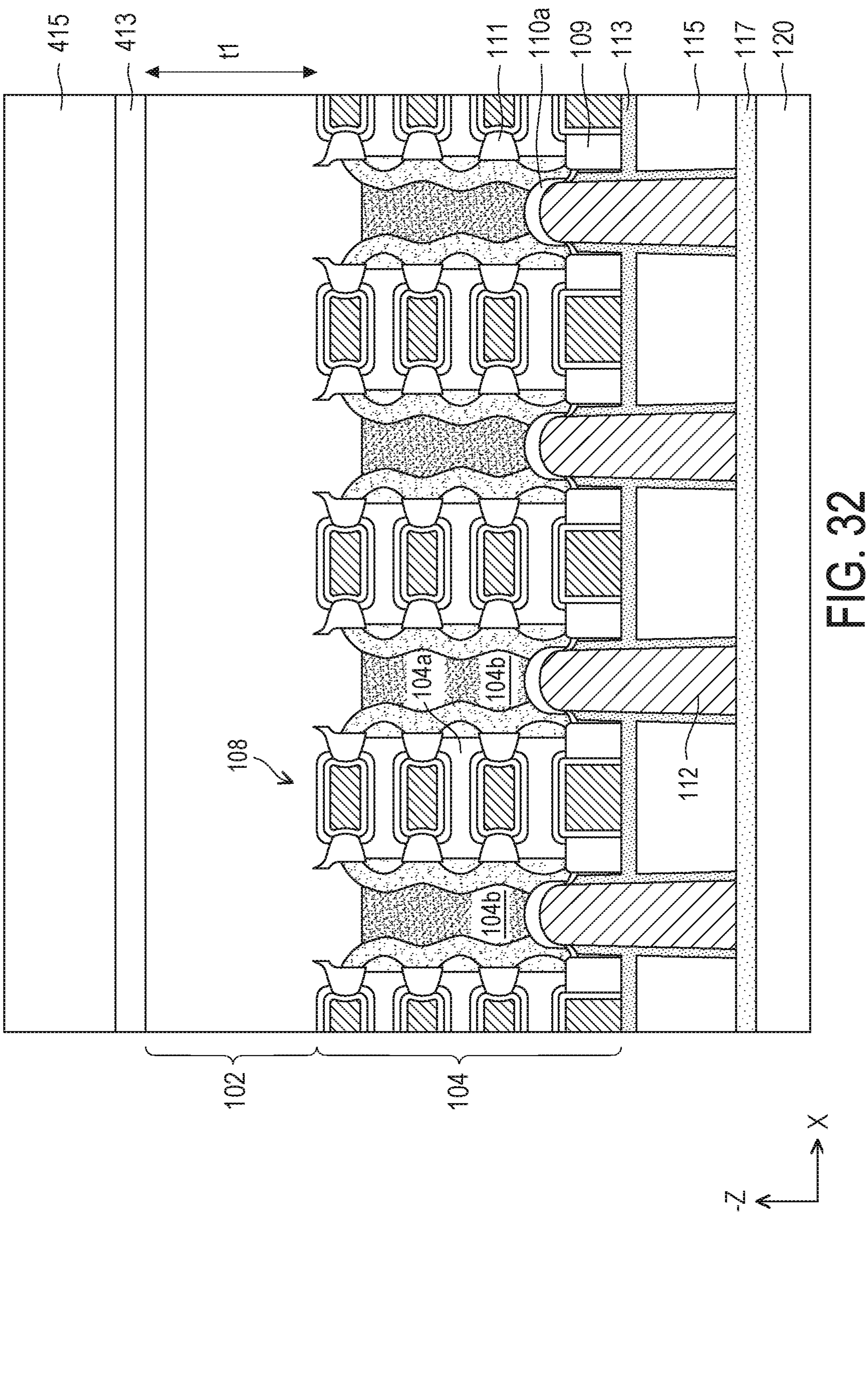
Figure 33:
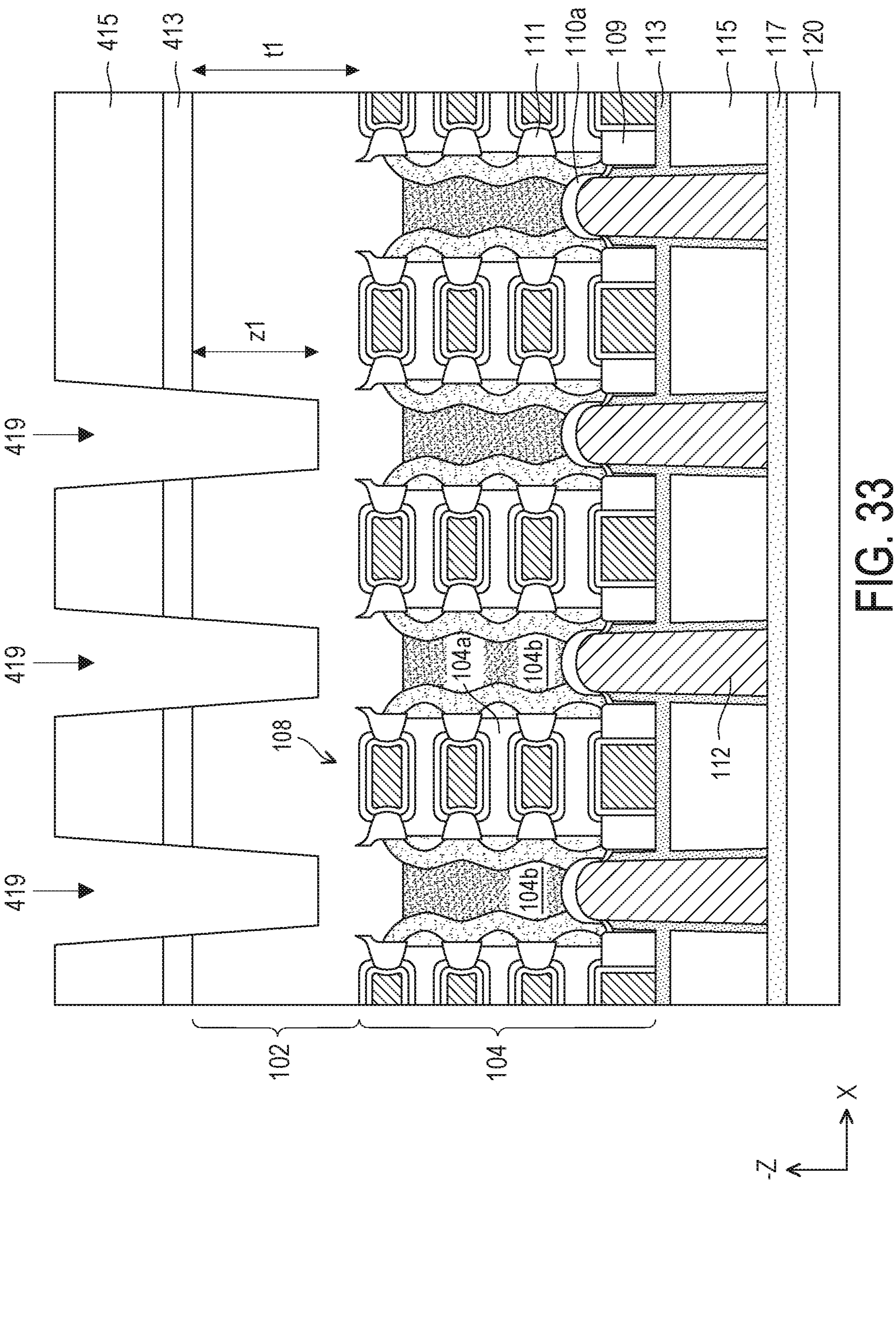

Referring now to FIGS. 30-32, the method 700 at operations 702-706 is similar to the method 500 at operations 502-506, respectively. Then, at operation 708, referring now to FIG. 33, the method 700 forms first trenches 419 through the first hard mask layer (e.g., silicon nitride and oxide films 413 and 415) and the substrate 102. The operation 708 may include performing a lithography process to form a patterned photoresist layer over the hard mask layer and etching the hard mask layer to transfer patterns from the patterned photoresist layer to the hard mask layer. Then, the operation 708 etches through the exposed portions of the substrate 102 using the patterned hard masks as an etch mask. The operation 708 may be a first step in a dual-damascene process. The first trenches 419 penetrates the substrate 102 to a first depth z1 below a top surface of the substrate 102. The depth z1 is less than the thickness t1 of the substrate 102. In an embodiment, the depth z1 is about 5 nm to about 15 nm less than the thickness t1. The first trenches 419 are vertically aligned with the backside of the epitaxial S/D features 104*b* but do not expose the epitaxial S/D features 104*b*. In other respects, the first trenches 419 in FIG. 21 are similar to the first trenches 419 previously described.

Figure 34:
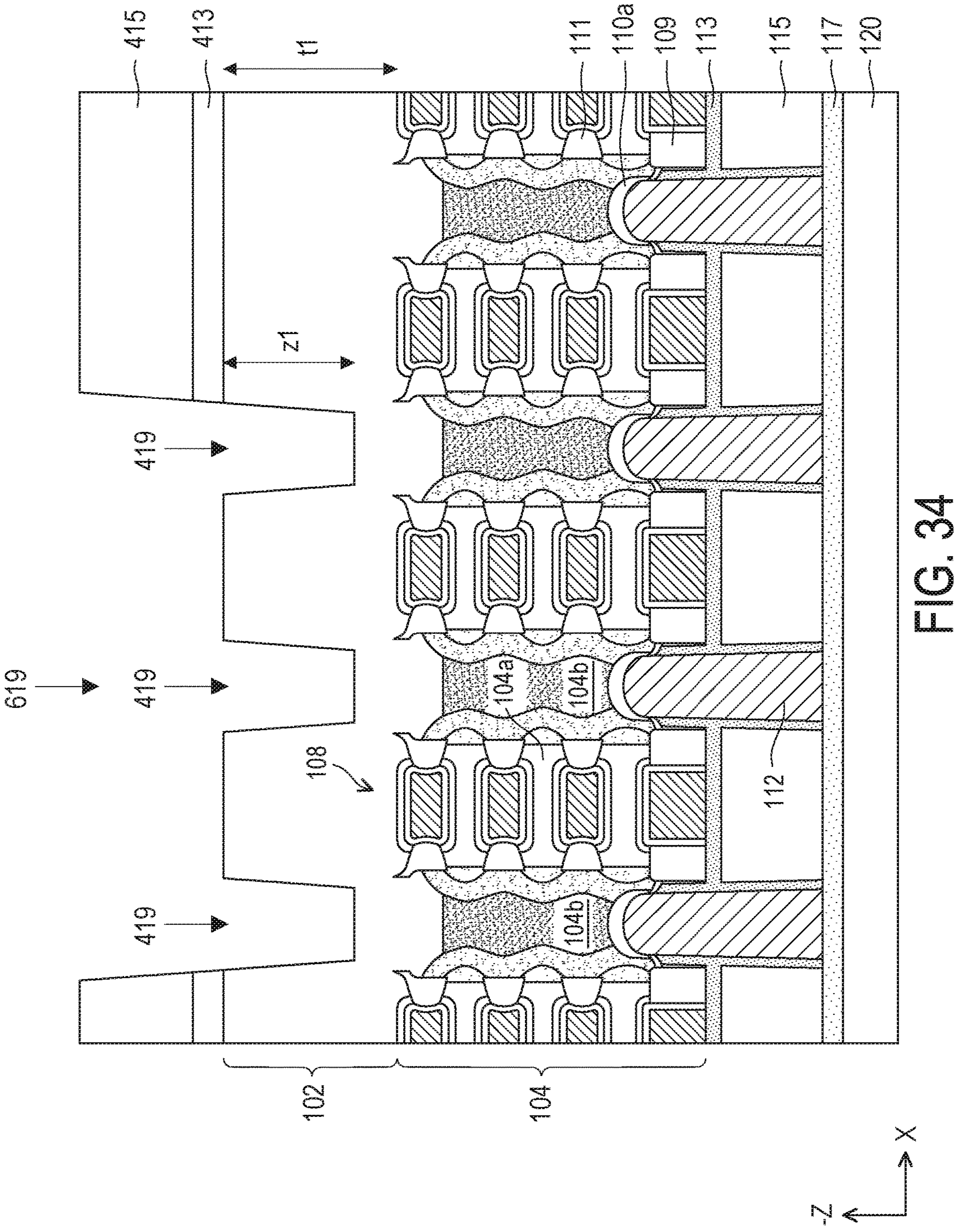
Figure 35:
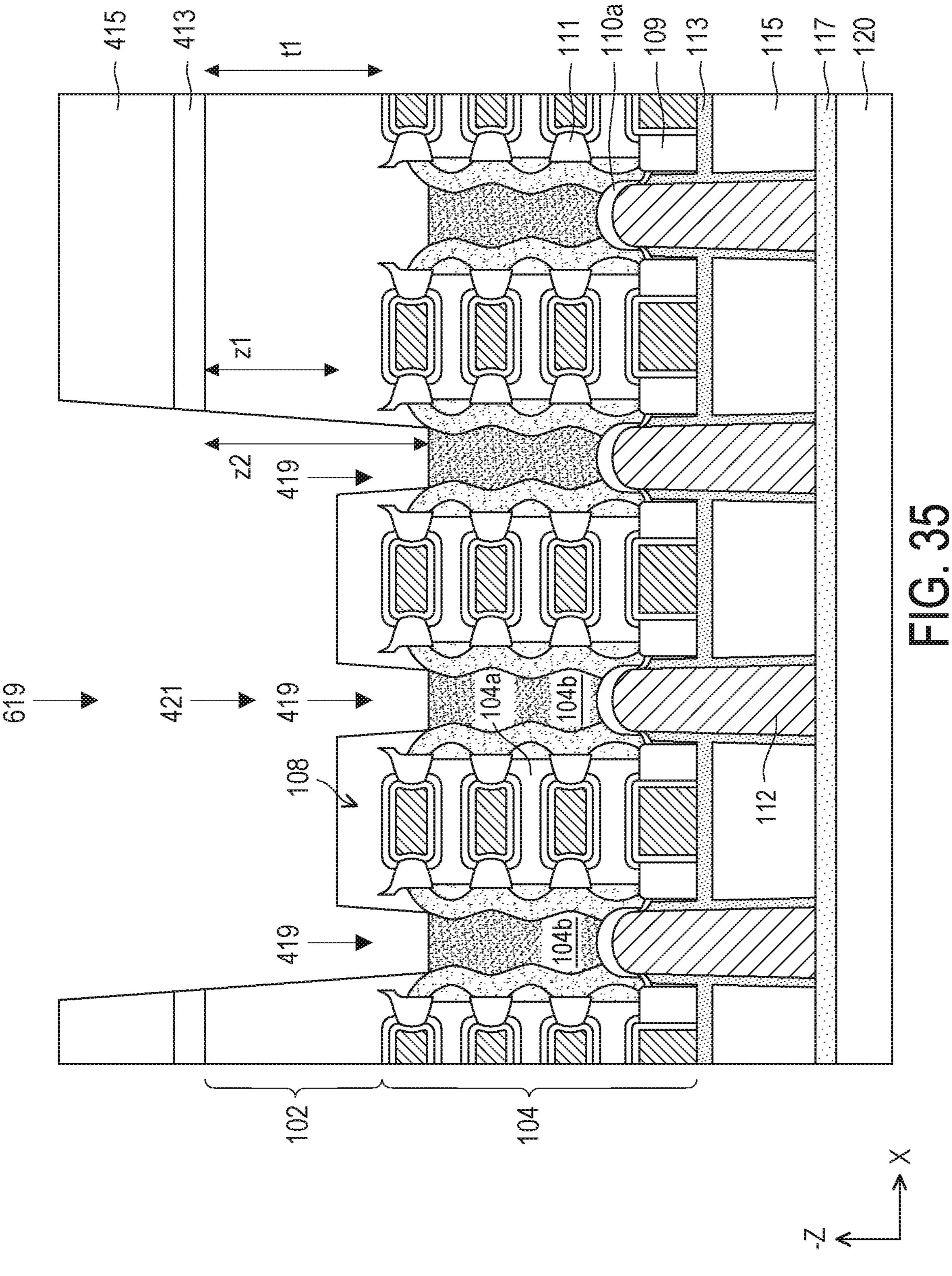

Referring now to FIG. 34, the method 700 at operation 710 forms a second hard mask layer on the backside of the substrate 102. This may involve further patterning of the silicon nitride and oxide films 413 and 415 to expose a single wide opening 619 or forming other hard mask patterned layers to expose a single wide opening 619. Referring now to FIG. 35, the method 700 at operation 712 forms a second trench 421 through the single wide opening 619 using the second hard mask layer (e.g., patterned silicon nitride and oxide films 413 and 415) as an etch mask. The operation 712 may be a second step in a dual-damascene process. The second trench 421 may penetrate through the substrate 102 to the depth z1 (or another depth smaller than the thickness t1), and the forming of the second trench 421 may cause the first trenches 419 to penetrate deeper into the substrate to a second depth z2. The first trenches 419 at this operation step exposes first S/D features 104*b* of the transistors. The second depth z2 is greater than the thickness t1, for example by about 5 nm to about 15 nm. In some embodiments, the difference between the depth z2 and depth z1 is about 15 nm to about 30 nm.

Figure 36:
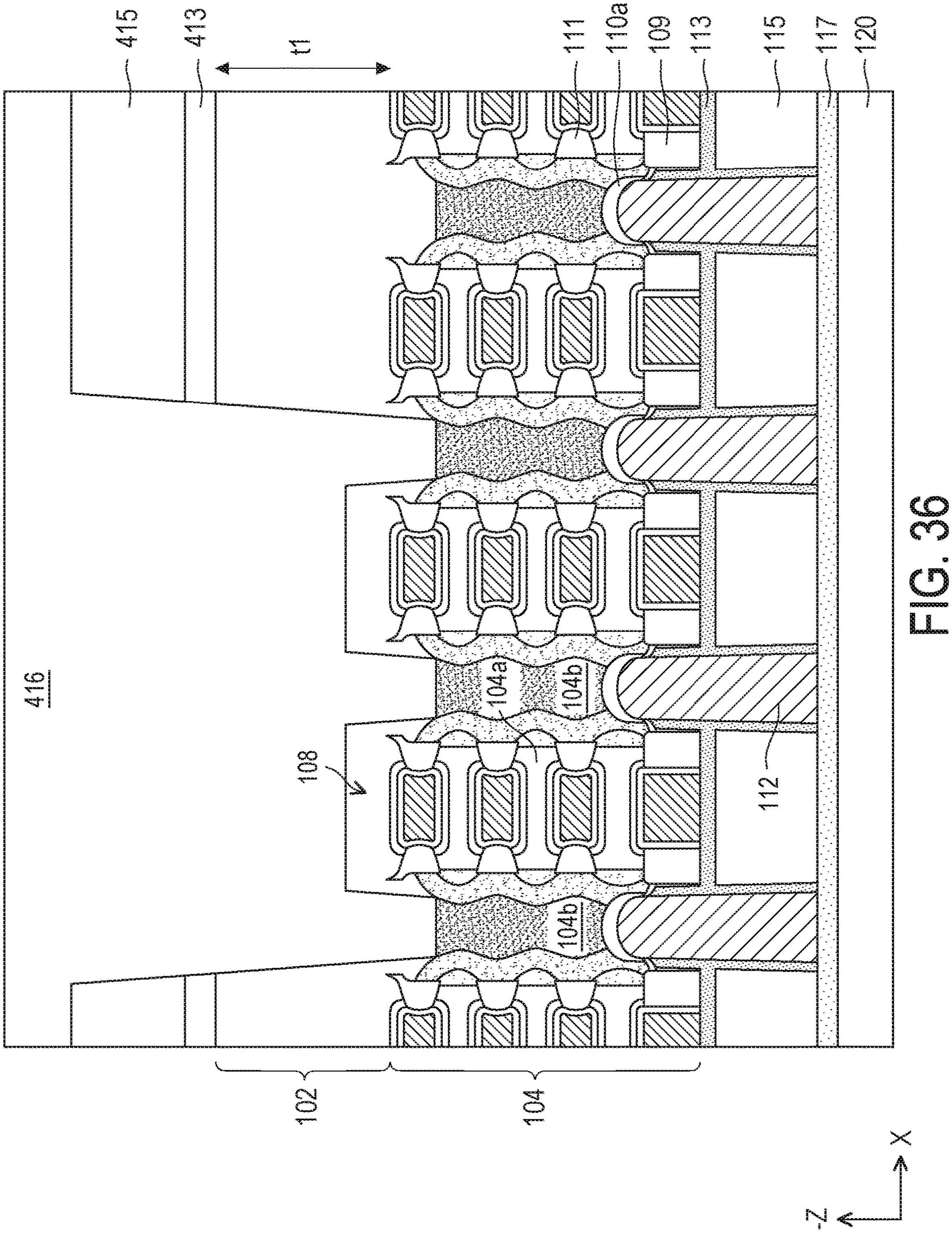

Referring now to FIG. 36, the method 700 at operation 714 deposits a dielectric material 416 into the first and second trenches 419 and 421 by any suitable deposition process. As previously described, the dielectric material 416 may include silicon oxide, silicon nitride, a low-k dielectric material, or a combination thereof. The operation 510 may include first depositing a conformal barrier film into the first and second trenches 419 and 421, then depositing a dielectric fill material over the conformal barrier film. Such a process results in a barrier layer 152 and dielectric fill layer 151 shown in FIG. 4. Alternatively, only a dielectric fill material is deposited into the first and second trenches 419 and 421. The deposition of the dielectric material 416 may be controlled such that air gaps 153 (not shown here but shown in FIG. 4) are formed surrounded by the dielectric material 416. For example, the deposition rate may be tuned to a higher rate to intentionally form voids in the first and second trenches 419 and 421. In a further embodiment, a porous dielectric material is deposited into the first and second trenches 419 and 421 to further facilitate trapped air. The air gaps 153 may provide further reduction of parasitic capacitance due to its low-k properties.

Figure 37:
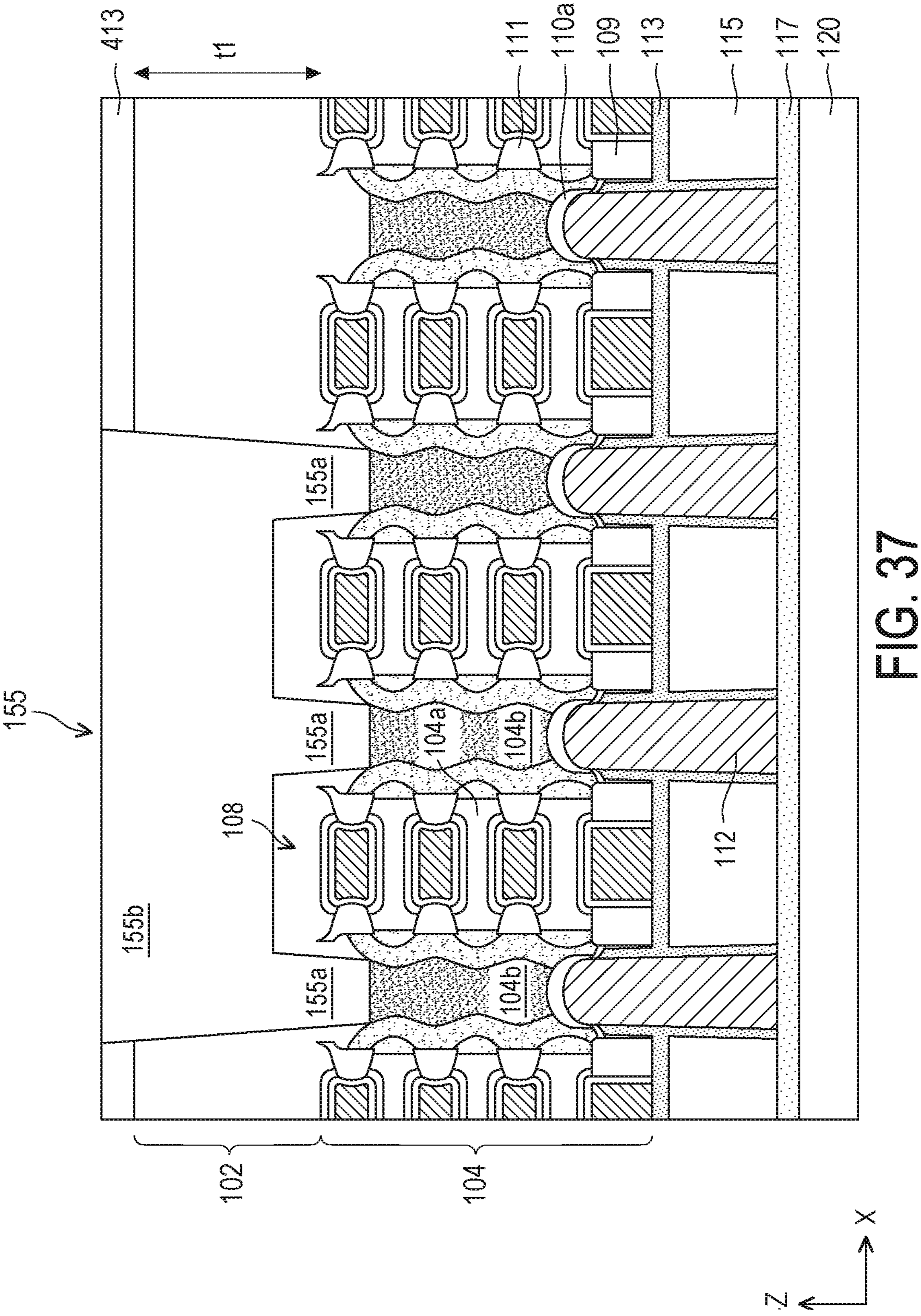

Referring now to FIG. 37, the method 700 at operation 716 planarizes the workpiece by a suitable process, such as dielectric CMP, to form an extended dielectric plug 155 having a bulk portion 155*b* and multiple penetrating portions 155*a*. The extended dielectric plug 155 corresponds to the extended dielectric plug 155 described with respect to FIG. 4 and will not be described again for the sake of brevity. In the present embodiment, the workpiece is planarized such that the silicon oxide film 415 is removed and a top surface of the extended dielectric plug 155 is coplanar with a top surface of the silicon nitride film 413. In another embodiment, the workpiece may be planarized such that the silicon nitride film 413 is also removed and a top surface of the extended dielectric plug 155 is coplanar with a top surface of the substrate 102.

Figure 38:
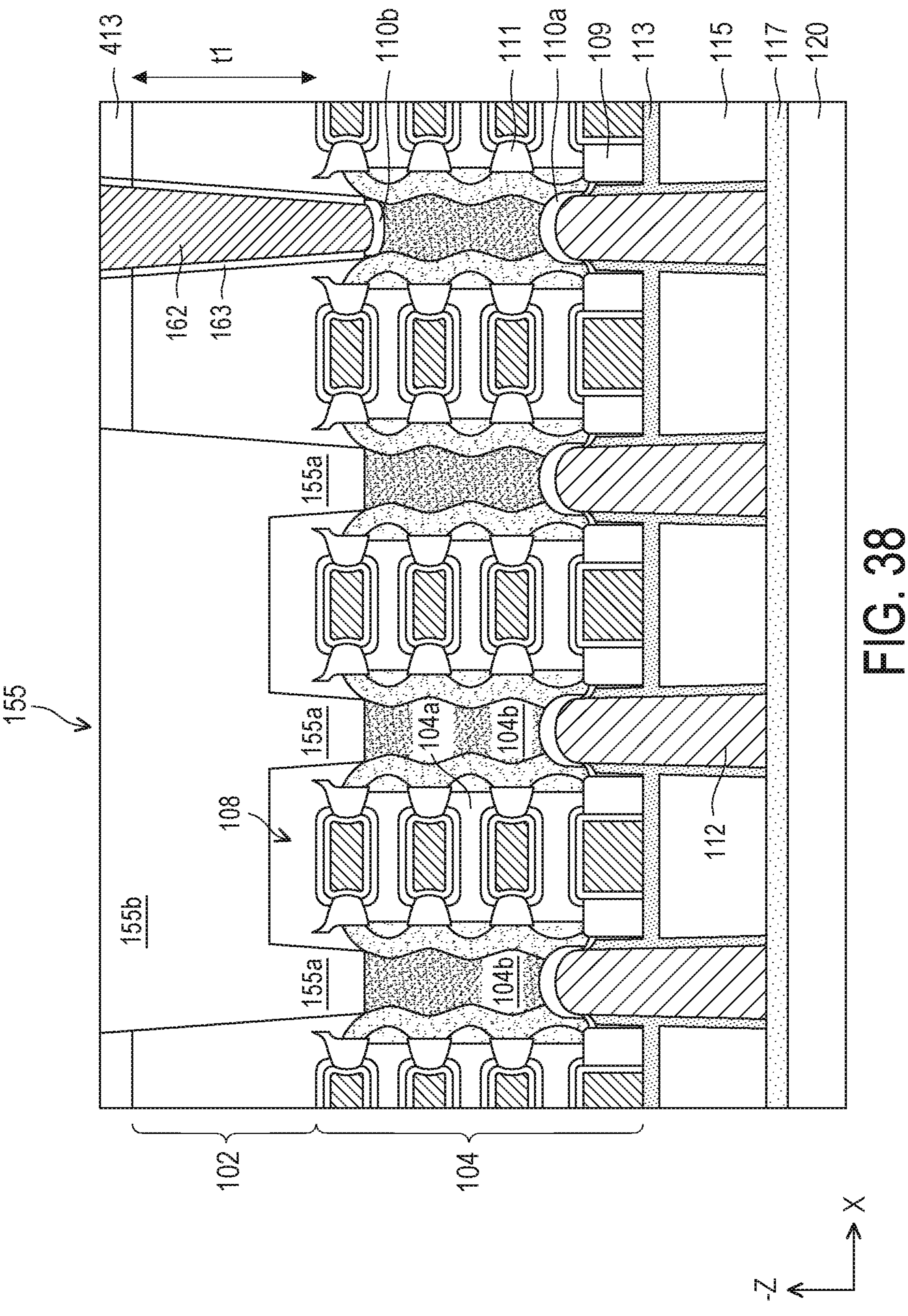

Referring now to FIG. 38, the method 700 at operation 718 may perform further steps such as forming one or more backside S/D contacts 162 to complete fabrication of the semiconductor device 100. Additional operations can be provided before, during, and after method 700, and some of the operations described can be moved, replaced, or eliminated for additional embodiments of method 700. Note that although the method 700 involves a more complicated process, the advantage in method 700 is a superior parasitic capacitance reduction without risking gate dielectric damage. This is because a greater amount of the substrate 102 is replaced by dielectric materials, while remaining portions of the substrate 102 can still provide heat dissipation.

Although not limiting, the present disclosure offers advantages for replacing substrate materials with dielectric materials. One example advantage is forming dielectric plugs from a backside of the substrate vertically aligned with the source/drain features and offset from the gate structures. This prevents gate dielectric damage. Another example advantage is performing an extra epitaxial recess into the source/drain features when forming the dielectric plugs. This provides additional parasitic capacitance reduction. Another example advantage is only partially removing the substrate while allowing remaining portion to provide heat dissipation. Another example advantage is forming extended dielectric plugs that include penetrating portions vertically aligned with source/drain features and a bulk portion that connects to the penetrating portions. The inclusion of the bulk portion produces even further parasitic capacitance reduction.

One aspect of the present disclosure pertains to a semiconductor device. The semiconductor device includes a semiconductor substrate and a transistor formed over the semiconductor substrate. The transistor includes a first source/drain (S/D) feature, a second S/D feature, a channel region interposed between the first and second S/D features, and a gate stack engaging the channel region. The semiconductor device includes a first S/D contact landing on a top surface of the first S/D feature, a second S/D contact landing on a top surface of the second S/D feature, and a dielectric plug penetrating through the semiconductor substrate and landing on a bottom surface of the first S/D feature. The dielectric plug spans a width equal to or smaller than a width of the first S/D feature.

In an embodiment, the dielectric plug is a first dielectric plug, and the semiconductor device further includes a second dielectric plug penetrating through the semiconductor substrate and landing on a bottom surface of the second S/D feature. The second dielectric plug is separated from the first dielectric plug by a portion of the semiconductor substrate.

In a further embodiment, the first dielectric plug further includes a first dielectric fill layer surrounded by a first barrier layer, the first dielectric fill layer has a first dielectric material, the first barrier layer has a second dielectric material different from the first dielectric material, and the first barrier layer directly contacts the bottom surface of the first S/D feature. The second dielectric plug further includes a second dielectric fill layer surrounded by a second barrier layer, the second dielectric fill layer has the first dielectric material, the second barrier layer has the second dielectric material, and the second barrier layer directly contacts the bottom surface of the second S/D feature.

In an embodiment, the semiconductor device further includes an S/D contact penetrating through the semiconductor substrate and landing on a bottom surface of the second S/D feature. The S/D contact is separated from the dielectric plug by a portion of the semiconductor substrate.

In a further embodiment, the dielectric plug further includes a dielectric fill layer surrounded by a first barrier layer, the dielectric fill layer has a first dielectric material, the first barrier layer has a second dielectric material different from the first dielectric material, and the first barrier layer directly contacts the bottom surface of the first S/D feature. The S/D contact further includes a conductive fill layer surrounded by a second barrier layer, the second barrier layer has the second dielectric material, and the conductive fill layer directly contacts the bottom surface of the second S/D feature.

In a further embodiment, the semiconductor substrate includes silicon, the first dielectric material includes silicon oxide, a low-k dielectric material, or a combination thereof, and the second dielectric material includes silicon nitride. In a further embodiment, the dielectric fill layer includes an air gap.

In an embodiment, a top surface of the dielectric plug is above the bottom surface of the gate stack. In a further embodiment, a vertical distance between the top surface of the dielectric plug and the bottom surface of the gate stack is greater than 5 nm.

Another aspect of the present disclosure pertains to a semiconductor device. The semiconductor device includes a semiconductor substrate and transistors formed over the semiconductor substrate. Each of the transistors includes a channel region interposed between source/drain (S/D) features and a gate stack engaging the channel region. The semiconductor device includes S/D contacts landing on top surfaces of the S/D features, and dielectric plugs penetrating through the semiconductor substrate and landing on bottom surfaces of the S/D features.

In an embodiment, one of the dielectric plugs is a first dielectric plug landing on the bottom surface of a first S/D feature, another one of the dielectric plugs is a second dielectric plug landing on the bottom surface of a second S/D feature, and the first and the second dielectric plugs are embedded in and separated from each other by the semiconductor substrate.

In an embodiment, each of the dielectric plugs spans laterally between two adjacent channel regions. In a further embodiment, each of the dielectric plugs has a lateral width of about 5 nm to about 20 nm. In a further embodiment, each of the dielectric plugs has a lateral width less than a lateral width of the S/D features.

In an embodiment, one of the dielectric plugs has a bulk portion and multiple penetrating portions protruding from the bulk portion, the bulk portion penetrates through the semiconductor substrate to a first depth, and the penetrating portions penetrates through the semiconductor substrate to a second depth greater than the first depth. The penetrating portions directly land on the bottom surfaces of the S/D features. In a further embodiment, the penetrating portions have top surfaces above bottom surfaces of each of the gate stacks, and the bulk portion have top surfaces below bottom surfaces of each of the gate stacks.

Another aspect of the present disclosure pertains to a method of forming a semiconductor device. The method includes receiving a work piece having transistors each of the transistors includes a channel region interposed between source/drain (S/D) features, and a gate stack engaging the channel region; thinning down the substrate from a backside of the workpiece; and forming dielectric plugs penetrating through the thinned down substrate to land on a first and a second S/D feature of the transistors, wherein the dielectric plugs are separated from each other by the thinned down substrate.

In an embodiment, the method further includes etching through the thinned down substrate to form a contact trench that expose a third S/D feature of the transistors; and forming a contact in the contact trench.

In an embodiment, the forming of the dielectric plugs includes forming a dummy dielectric plug penetrating through the thinned down contact to land on a third S/D feature of the transistors, further comprising: removing the dummy dielectric plug to form a contact trench; and forming a contact in the contact trench.

In an embodiment, the forming of the dielectric plugs includes etching the thinned down substrate to form first trenches that expose the S/D features. The etching includes recessing a portion of the S/D features; and depositing a dielectric material in the first trenches.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
- a semiconductor substrate;
- a transistor formed over the semiconductor substrate, wherein the transistor includes a first source/drain (S/D) feature, a second S/D feature, a channel region interposed between the first and second S/D features, and a gate stack engaging the channel region;
- a first S/D contact landing on a top surface of the first S/D feature;
- a second S/D contact landing on a top surface of the second S/D feature; and
- a dielectric plug penetrating through the semiconductor substrate and landing on a bottom surface of the first S/D feature, the dielectric plug spans a width equal to or smaller than a width of the first S/D feature.

2. The semiconductor device of claim 1, wherein the dielectric plug is a first dielectric plug, further comprising:
- a second dielectric plug penetrating through the semiconductor substrate and landing on a bottom surface of the second S/D feature, wherein the second dielectric plug is separated from the first dielectric plug by a portion of the semiconductor substrate.

3. The semiconductor device of claim 2,
- wherein the first dielectric plug further includes a first dielectric fill layer surrounded by a first barrier layer, the first dielectric fill layer has a first dielectric material, the first barrier layer has a second dielectric material different from the first dielectric material, and the first barrier layer directly contacts the bottom surface of the first S/D feature,
- wherein the second dielectric plug further includes a second dielectric fill layer surrounded by a second barrier layer, the second dielectric fill layer has the first dielectric material, the second barrier layer has the second dielectric material, and the second barrier layer directly contacts the bottom surface of the second S/D feature.

4. The semiconductor device of claim 1, further comprising:
- a backside S/D contact penetrating through the semiconductor substrate and landing on a bottom surface of the second S/D feature, wherein the backside S/D contact is separated from the dielectric plug by a portion of the semiconductor substrate.

5. The semiconductor device of claim 4,
- wherein the dielectric plug further includes a dielectric fill layer surrounded by a first barrier layer, the dielectric fill layer has a first dielectric material, the first barrier layer has a second dielectric material different from the first dielectric material, and the first barrier layer directly contacts the bottom surface of the first S/D feature,
- wherein the backside S/D contact further includes a conductive fill layer surrounded by a second barrier layer, the second barrier layer has the second dielectric material, and the conductive fill layer directly contacts the bottom surface of the second S/D feature.

6. The semiconductor device of claim 5,
- wherein the semiconductor substrate includes silicon,
- wherein the first dielectric material includes silicon oxide, a low-k dielectric material, or a combination thereof,
- wherein the second dielectric material includes silicon nitride.

7. The semiconductor device of claim 5, wherein the dielectric fill layer includes an air gap.

8. The semiconductor device of claim 1, wherein a top surface of the dielectric plug is above the bottom surface of the gate stack.

9. The semiconductor device of claim 8, wherein a vertical distance between the top surface of the dielectric plug and the bottom surface of the gate stack is greater than 5 nm.

10. A semiconductor device, comprising:
- a semiconductor substrate;
- transistors formed over the semiconductor substrate, wherein each of the transistors includes a channel region interposed between source/drain (S/D) features and a gate stack engaging the channel region;
- S/D contacts landing on top surfaces of the S/D features; and
- dielectric plugs penetrating through the semiconductor substrate and landing on bottom surfaces of the S/D features.

11. The semiconductor device of claim 10,
- wherein one of the dielectric plugs is a first dielectric plug landing on the bottom surface of a first S/D feature, another one of the dielectric plugs is a second dielectric plug landing on the bottom surface of a second S/D feature, and the first and the second dielectric plugs are embedded in and separated from each other by the semiconductor substrate.

12. The semiconductor device of claim 10, wherein each of the dielectric plugs spans laterally between two adjacent channel regions.

13. The semiconductor device of claim 12, wherein each of the dielectric plugs has a lateral width of about 5 nm to about 20 nm.

14. The semiconductor device of claim 12, wherein each of the dielectric plugs has a lateral width less than a lateral width of the S/D features.

15. The semiconductor device of claim 10,
- wherein one of the dielectric plugs has a bulk portion and multiple penetrating portions protruding from the bulk portion, the bulk portion penetrates through the semiconductor substrate to a first depth, and the penetrating portions penetrates through the semiconductor substrate to a second depth greater than the first depth,
- wherein the penetrating portions directly land on the bottom surfaces of the S/D features.

16. The semiconductor device of claim 15, wherein the penetrating portions have top surfaces above bottom surfaces of each of the gate stacks, and the bulk portion have top surfaces below bottom surfaces of each of the gate stacks.

17. A method of forming a semiconductor device, comprising:

receiving a workpiece having transistors formed over a substrate, each of the transistors includes a channel region interposed between source/drain (S/D) features, and a gate stack engaging the channel region;

thinning down the substrate from a backside of the workpiece; and forming dielectric plugs penetrating through the thinned down substrate to land on a first and a second S/D feature of the transistors, wherein the dielectric plugs are separated from each other by the thinned down substrate.

18. The method of claim 17, further comprising:

etching through the thinned down substrate to form a contact trench that expose a third S/D feature of the transistors; and forming a contact in the contact trench.

19. The method of claim 17, wherein the forming of the dielectric plugs includes forming a dummy dielectric plug penetrating through the thinned down substrate to land on a third S/D feature of the transistors, further comprising:

removing the dummy dielectric plug to form a contact trench; and forming a contact in the contact trench.

20. The method of claim 17, wherein the forming of the dielectric plugs comprises:

etching the thinned down substrate to form first trenches that expose the S/D features, wherein the etching includes recessing a portion of the S/D features; and depositing a dielectric material in the first trenches.

* * * * *